(12) United States Patent
Gorsica et al.

(10) Patent No.: US 11,050,935 B1
(45) Date of Patent: Jun. 29, 2021

(54) METHODS AND SYSTEMS FOR MANAGING ONE OR MORE INERTIAL MOTION UNITS IN A HINGED ELECTRONIC DEVICE

(71) Applicant: Motorola Mobility LLC, Chicago, IL (US)

(72) Inventors: John Gorsica, Round Lake, IL (US); Eric Hefner, Lombard, IL (US); Jenna Zylema, Chicago, IL (US); Igor Kovalenko, Palatine, IL (US)

(73) Assignee: Motorola Mobility LLC, Chicago, IL (US)

( * ) Notice: Subject to any disclaimer, the term of this patent is extended or adjusted under 35 U.S.C. 154(b) by 14 days.

(21) Appl. No.: 16/725,868

(22) Filed: Dec. 23, 2019

(51) Int. Cl.
| | |
|---|---|
| *H04N 5/232* | (2006.01) |
| *H05K 5/00* | (2006.01) |
| *H05K 5/02* | (2006.01) |
| *H04N 5/225* | (2006.01) |
| *G01C 21/10* | (2006.01) |

(52) U.S. Cl.
CPC ......... *H04N 5/23245* (2013.01); *G01C 21/10* (2013.01); *H04N 5/2252* (2013.01); *H05K 5/0004* (2013.01); *H05K 5/0226* (2013.01)

(58) Field of Classification Search
CPC ............... H04N 5/2324; H04N 5/2252; H04N 5/23245; H05K 5/0004; H05K 5/0226; G01C 21/10
See application file for complete search history.

(56) References Cited

U.S. PATENT DOCUMENTS

2016/0147266 A1* 5/2016 Chng .................... G06F 1/1677
  713/100

OTHER PUBLICATIONS

Kok, et al., "Using Inertial Sensors for Position and Orientation Estimation", 2017 Foundation and Trends in Signal Processing: vol. 11: No. 1-2, pp. 1-1153; http://dx.doi.org/10.1561/2000000094; published online Jun. 10 2018.

Mourcou, et al., "Performance Evaluation of Smartphone Intertial Sensors Measurement for Range of Motion", Published Sep. 15, 2015; Open Access Sensors; www.mdpi.com/journal/sensors.

Seel, et al., "IMU-Based Joint Angle Measurement for Gait Analysis", Published Apr. 16, 2014; Open Access Sensors; www.mdpi.com/jounal/sensors.

* cited by examiner

*Primary Examiner* — Ahmed A Berhan
(74) *Attorney, Agent, or Firm* — Philip H. Burrus, IV

(57) ABSTRACT

An electronic device includes a first device housing and a second device housing, with a hinge coupling the first device housing to the second device housing such that the first device housing is pivotable about the hinge relative to the second device housing between a closed position and an axially displaced open position. At least one inertial motion unit is situated in the first device housing and determines an orientation of the first device housing in three-dimensional space, delivering the same in an orientation determination signal. An inertial motion unit adjustment engine, activated by at least one predefined condition of electronic device, can apply at least one correction factor to the orientation determination signal when activated to create a modified orientation determination signal.

20 Claims, 10 Drawing Sheets

METHODS AND SYSTEMS FOR MANAGING ONE OR MORE INERTIAL MOTION UNITS IN A HINGED ELECTRONIC DEVICE

BACKGROUND

Technical Field

This disclosure relates generally to methods and systems for electronic devices having one or more internal motion units, and more particularly to methods and systems for physically deformable electronic devices having one or more internal motion units.

Background Art

Mobile electronic communication devices, such as mobile telephones, smart phones, gaming devices, and the like, have become ubiquitous. These devices are used for a variety of purposes, including voice and video telecommunications, sending and receiving text and multimedia messages, Internet browsing, electronic commerce, and social networking. Many are equipped with imagers that can be used to capture images, among other features. It would be advantageous to have improved methods and systems operable with these imagers and other features to improve the performance of the same.

Figure 1:
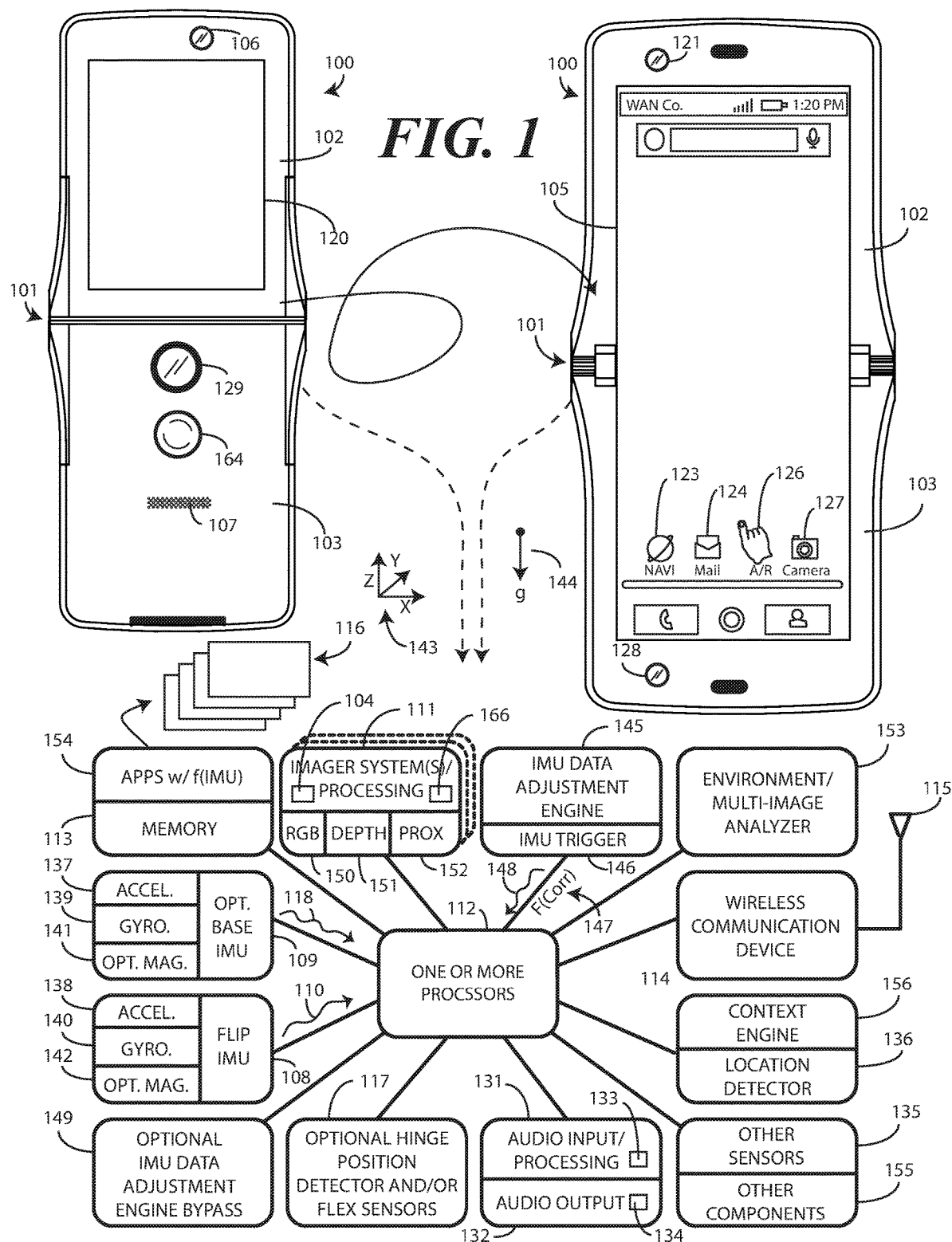
FIG. 1 illustrates one explanatory electronic device, along with an explanatory schematic block diagram, in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to adjusting, in an electronic device that includes a single inertial motion unit, an orientation determination signal output by the single inertial motion unit or, in an electronic device having multiple inertial motion units, managing and/or adjusting orientation determination signals output by the plurality of inertial motion units. Process descriptions or blocks in a flow chart can be modules, segments, or portions of code that implement specific logical functions of a machine or steps in a process, or alternatively that transition specific hardware components into different states or modes of operation. Alternate implementations are included, and it will be clear that functions may be executed out of order from that shown or discussed, including substantially concurrently or in reverse order, depending on the functionality involved.

It will be appreciated that embodiments of the disclosure described herein may be comprised of one or more conventional processors and unique stored program instructions that control the one or more processors to implement, in conjunction with certain non-processor circuits, some, most, or all of the functions of performing control operations such as activating an inertial motion unit adjustment engine in response to detecting, optionally with one or more sensors, a predefined condition of the electronic device and/or applying, with the inertial motion unit adjustment engine at least one correction factor to an orientation determination signal received from at least one inertial motion unit when the inertial motion unit adjustment engine is activated. The non-processor circuits may include, but are not limited to, imaging devices, flash devices, microphones, loudspeakers, acoustic amplifiers, digital to analog converters, signal drivers, clock circuits, power source circuits, and user input devices.

As such, these functions may be interpreted as steps of a method to perform operations such as reporting an unmodified orientation determination signal to one or more applications operating on one or more processors when the inertial motion unit adjustment engine is deactivated, while reporting a modified orientation determination signal to the one or more applications when the inertial motion unit adjustment engine is activated, reporting a first orientation determination signal received from a first inertial motion unit to the one or more applications when the inertial motion unit adjustment engine is deactivated, while reporting a second orientation determination signal from a second inertial motion unit to the one or more applications when the inertial motion unit adjustment engine is activated, reporting a first orientation determination signal receives from a first inertial motion unit to the one or more applications when the inertial motion unit adjustment engine is deactivated, while reporting a second orientation determination signal received from a second inertial motion unit to the one or more processors after modification by the inertial motion unit adjustment engine when the inertial motion unit adjustment engine is activated, or combinations thereof.

Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ASICs with minimal experimentation.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device having a hinged housing, improve the functioning of the electronic device itself by facilitating a more accurate operation of features and applications, including a higher quality capture and presentation of images captured by an imager, to improve the overall user experience to overcome problems specifically arising in the realm of the technology associated with image capture in electronic devices having hinged housings.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide a hinged electronic device having one or more features or applications that depend upon orientation determination signals received from an inertial motion unit. As understood in the art, an inertial motion unit is an electronic device that can include a combination of one or more accelerometers, one or more gyroscopes, and optionally one or more magnetometers to determine an object's orientation, angular velocity, and specific force. When used in a portable electronic device, such as a smartphone, tablet computer, or other device, an inertial motion unit can be used as an orientation sensor to measure the orientation of the electronic device or a component of the electronic device in three-dimensional space, motion of the electronic device or a component of the electronic device in three-dimensional space, and other measurements.

Embodiments of the disclosure contemplate that certain features of such devices, such as image capture operations, can benefit from the use of orientation determination signals received from an inertial motion unit. Illustrating by example, where an electronic device is equipped with an imager, the orientation determination signals from the inertial motion unit can be used to perform electrical image stabilization processes to eliminate blur and other image noise caused by a person's hand shaking while taking a picture. Additionally, when an electronic device includes an augmented reality application configured to superimpose information, graphics, data, or other indicia atop an image, the orientation determination signals received from the inertial motion unit can help ensure that this information, graphics, data, or other indicia is properly placed atop the captured image or images. If, for example, a person is using a navigation application in a smartphone and is capturing still or video images of the Sears Tower, with an augmented reality application or feature of the navigation application superimposing a graphic stating, "This is the Sears Tower," the orientation determination signals received from the inertial motion unit can ensure that the graphic stays right above the tower as the user moves the electronic device, and thus, the image capture device, around in three-dimensional space.

At the same time, embodiments of the disclosure contemplate that for optimal performance, features employing orientation determination signals received from inertial motion units should have tight angular alignment with the inertial motion unit. For example, if an imager uses orientation determination signals from an inertial motion unit as input for image stabilization operations, embodiments of the disclosure contemplate that locating the inertial motion unit as closely as possible to the imager works to reduce the instances of the orientation determination signals not as accurately measuring the motion of the imager due to a distance separating the imager and the inertial motion unit. Moreover, when an inertial motion unit is located relatively closely to a component that can affect its measurement capability, such as near an electromagnetic antenna or vibrational motor, this can degrade the performance of features of the electronic device relying upon orientation determination signals received from the inertial motion unit as well.

Embodiments of the disclosure contemplate that these problems are exacerbated in a hinged electronic device. Illustrating by example, if an electronic device comprises a first device housing and a second device housing separated by a hinge, with the first device housing being pivotable about the hinge relative to the second device housing between a closed position and an axially displaced open position, problems can become more severe when a feature relying on orientation determination signals from an inertial motion unit is positioned within the first device housing and the inertial motion unit itself is positioned in the second device housing. Not only does this cause a large distance to exist between the feature and the inertial motion unit, but the first device housing and second device housing can be aligned at various angles about the hinge relative to each other, thereby increasing the inaccuracies of measurement of the inertial motion unit for the feature.

Advantageously, embodiments of the present disclosure provide solutions to this and other issues by providing methods and systems for managing one or more inertial motion units in a foldable electronic device having a first device housing that is pivotable about a hinge relative to a second device housing between a closed position and an axially displaced open position. In one or more embodiments, embodiments of the disclosure employ one inertial motion unit, which is situated near a feature that relies heavily upon orientation determination signals from the inertial motion unit in the same device housing as the feature. For instance, where an electronic device includes a first device housing and a second device housing separated by a hinge, in one or more embodiments a feature relying heavily upon the inertial motion unit, such as an imager, and the inertial motion unit itself are positioned in the first device housing. Since other applications may also rely upon the orientation determination signals of the inertial motion unit, and as the first device housing can be pivoted about the hinge relative to the second device housing to any number of different angles, in one or more embodiments an inertial motion unit adjustment engine, which is activated by at least one predefined condition of the electronic device, applies, when activated, at least one correction factor to the orientation determination signal of the inertial motion unit to create a modified orientation determination signal. In one or more embodiments, when the inertial motion unit adjustment engine is not activated, the raw orientation determination signals are delivered to the various features relying upon the orientation determination signals. By contrast, when the inertial motion unit adjustment engine is active, in one or more embodiments the modified orientation determination signals are reported to these features.

In one or more embodiments, when enabling—or disabling—the inertial motion unit adjustment engine, to prevent any discontinuity that may be introduced into the stream of orientation data being delivered to the applications operating on the one or more processors resulting from any instantaneous jumps in the orientation data due to hinge alignment accuracy, measurement latency, or latency in detecting the inertial motion unit adjustment engine activation event, embodiments of the disclosure include mechanisms to smooth the data that the one or more processors report to the applications. Illustrating by example, in one embodiment the inertial motion unit adjustment engine and/or the one or more processors can filter the orientation data sent in the orientation determination signals as they are delivered to the applications during the transition. In another embodiment, the inertial motion unit adjustment engine and/or the one or more processors can intentionally interrupt the data stream, such as by dropping orientation determination data samples of the orientation determination signals, thereby providing an indicator to the applications that the instantaneous orientation data is in transition. In still another embodiment, the inertial motion unit adjustment engine and/or one or more processors can introduce data into the orientation determination signals indicating that the measurements are in transition and may not have their normal, steady state accuracy while the introduced data is found in the orientation data signals. Other techniques for assisting the applications in interpreting the orientation determination data of the orientation determination signals will be obvious to those of ordinary skill in the art having the benefit of this disclosure.

Advantageously, including an inertial motion unit adjustment engine allows for corrections to be applied due to various angular configurations that may occur between the first device housing and the second device housing about the hinge. In one illustrative embodiment, a first device housing comprises a "flip," which is the portion of the electronic device one flips when opening the electronic device. A second device housing comprises a "base," which one holds when flipping the flip. In one or more embodiments, an imager and an inertial motion unit are collocated in the flip. In one or more embodiments, one or more processors operable with the inertial motion unit report the orientation determination signals from the inertial motion unit to all applications and/or features relying upon the same, including the imager, when the inertial motion unit adjustment engine is inactive. However, when the inertial motion unit adjustment engine is active, and applies the at least one correction factor to the orientation determination signals, the one or more processors report the modified orientation determination signals to the applications and/or features.

In one or more embodiments, the inertial motion unit adjustment engine is activated when the flip is closed against the base. Said differently, in one or more embodiments, the inertial motion unit adjustment engine is activated when the first device housing pivots about the hinge relative to the second device housing to the closed position. In one such embodiment, the at least one correction factor applied by the inertial motion unit adjustment engine comprises an inversion. For example, where the orientation determination signal comprises orientation measurements along the three dimensions of three-dimensional space, i.e., the X-dimension, the Y-dimension, and the Z-dimension, in one or more embodiments the at least one correction factor causes an inversion of the orientation measurements of two dimensions of the three dimensions of the three-dimensional space. Thus, if the X-axis runs through the major axis of the hinge, in one or more embodiments the inertial motion unit adjustment engine causes the measurements of the Y-axis and Z-axis to invert in the modified orientation determination signals when the first device housing pivots about the hinge relative to the second device housing to the closed position.

In one or more embodiments, the predefined condition activating the inertial motion unit adjustment engine comprises a predefined angle occurring between the flip and the base. Said differently, in one or more embodiments the predefined condition triggering activation of the inertial motion unit adjustment engine comprises a predefined angle occurring between the first device housing and the second device housing about the hinge. For instance, the inertial motion unit adjustment engine may be deactivated when the flip is closed with the first device housing pivoted about the hinge relative to the second device housing to the closed position. However, any movement of the first device housing about the hinge relative to the second device housing beyond this abutting, zero angle position, such as through predefined angles of one degree, two degrees, three degrees, and so forth up to as much as 180 degrees, may trigger actuation of the inertial motion unit adjustment engine.

In one or more embodiments, when the inertial motion unit adjustment engine is active, it applies, as a correction factor, a rotation matrix that is a function of the predefined angle between the first device housing and the second device housing. If, for example, the angle between the first device housing and the second device housing is one degree, the inertial motion unit adjustment engine may apply a rotational matrix adjusting the tilt, plumb, or azimuth measurements in the orientation determination signals received from the inertial motion unit with a first rotational matrix. Similarly, when the angle between the first device housing and the second device housing is two degrees, the inertial motion unit adjustment engine may apply another rotational matrix adjusting the tilt, plumb, or azimuth measurements in the orientation determination signals received from the inertial motion unit with a second rotational matrix, and so forth. Thus, the inertial motion unit adjustment engine can transform the orientation determination signals received from the inertial motion unit, using the various rotational matrices, as a function of the angle between the first device housing and the second device housing about the hinge in one or more embodiments.

In still other embodiments, multiple inertial motion units can be employed. At least one inertial motion unit can be positioned within the first device housing, while at least one other inertial motion unit can be placed in the second device housing. In one or more embodiments, one or more processors of the electronic device operable with the at least one inertial motion unit and the at least one other inertial motion unit can report different signals based upon different conditions of the electronic device.

For instance, in one or more embodiments the one or more processors can report a second device housing orientation determination signal received from the at least one other inertial motion unit to one or more applications and/or features relying upon the same when the inertial motion unit adjustment engine is deactivated. By contrast, when the inertial motion unit adjustment engine is activated, the one or more processors can report a first device housing orientation determination signal received from the at least one inertial motion unit to the one or more applications and/or features relying upon the same instead of the second device housing orientation determination signal. Thus, in one or more embodiments the one or more processors report the orientation determination signals received from the inertial motion unit situated in the base unless a predefined condition of the electronic device is detected, at which time the one or more processors switch from reporting the orientation determination signals received from the inertial motion unit situated in the base to the other orientation determination signals received from the inertial motion unit situated in the flip.

In addition to this "orientation determination signal reporting" switch, the inertial motion unit adjustment engine can also apply the correction factors described above, which include applying a rotational matrix as a function of an angle between the first device housing and the second device housing about the hinge, inverting one or more axes of three-dimensional space when the first device housing is pivoted about the hinge relative to the second device housing to the closed position, or in other ways. Thus, in one or more embodiments where the inertial motion unit adjustment engine applies at least one correction factor to the first device housing orientation determination signal when activated to create a modified first device housing orientation determination signal, the one or more processors can report the second device housing orientation determination signal to the one or more applications when the inertial motion unit adjustment engine is deactivated, and reporting the modified first device housing orientation determination signal to the one or more applications instead of the second device housing orientation determination signal when the inertial motion unit adjustment engine is activated.

Whether orientation determination signals from the inertial motion unit situated in the flip are reported instead of orientation determination signals from the inertial motion unit situated in the base, as well as whether any of the orientation determination signals are modified by the inertial motion unit adjustment engine can be triggered by other factors as well. As noted above, embodiments of the disclosure contemplate that an imager and corresponding applications may heavily rely upon accurate orientation determination signals to perform image stability operations, augmented reality operations, or other operations. Thus, in one or more embodiments the one or more processors of the electronic device report orientation determination signals from the inertial motion unit situated in the base to applications and/or features when the imager is inactive, but report orientation determination signals from the inertial motion unit situated in the flip when the imager is activated. These orientation determination signals from the inertial motion unit in the flip can optionally be modified by the at least one correction factor or rotational matrix as previously described. In another embodiment, the one or more processors of the electronic device report orientation determination signals from the inertial motion unit situated in the base to applications and/or features when an augmented reality application or feature is inactive, but report orientation determination signals from the inertial motion unit situated in the flip when the augmented reality application or feature is activated. These orientation determination signals from the inertial motion unit in the flip can also optionally be modified by the at least one correction factor or rotational matrix as previously described.

Accordingly, as set forth herein, in one or more embodiments the one or more processors always report orientation determination signals from the inertial motion unit situated in the flip, but invert two axes of the three dimensions of three-dimensional space when the flip is closed against the base. In one or more embodiments, the one or more processors always report the orientation determination signals from the inertial motion unit situated in the flip, but transform the orientation determination signals by applying a rotational matrix that is a function of the angle between the flip and base, i.e., is a function of an angle between the first device housing and the second device housing about the hinge.

In one or more embodiments, the one or more processors report the orientation determination signals from the inertial motion unit situated in the base unless the imager is operationally active, in which case the one or more processors instead report the orientation determination signals from the inertial motion unit situated in the flip, optionally being modified by the at least one correction factor and/or rotational matrix. In one or more embodiments, the one or more processors report the orientation determination signals from the inertial motion unit situated in the base unless an augmented reality feature or application is active, in which case the one or more processors instead report the orientation determination signals from the inertial motion unit situated in the flip, optionally being modified by the at least one correction factor and/or rotational matrix. Other configurations will be described below. Still others will be obvious to those of ordinary skill in the art having the benefit of this disclosure.

Embodiments of the disclosure can advantageously be used with foldable devices, including those that include flexible displays. Embodiments of the disclosure advantageously eliminate the errors associated with a "flip carried" component, such as an imager, relying upon a "base carried" inertial motion unit by eliminating errors introduced by hinge alignment and hinge angle between the base and flip device housings. Embodiments of the disclosure enhance the operation of augmented reality hardware, applications, and features, electronic image stabilization hardware, applications, and features, and other features of electronic devices configured in accordance with embodiments of the disclosure.

In one or more embodiments, a hinged electronic device includes at least one imager. In one or more embodiments, the electronic device includes a single imager. This single imager, sometimes known as an exterior imager or front-facing imager, is exposed both when the first device housing and the second device housing are pivoted about the hinge to the closed position or the axially displaced open position. In other embodiments, the electronic device will include at least a first imager and a second imager, with the second imager being an interior or rear-facing imager that is concealed when the first device housing is pivoted about the hinge relative to the second device housing to the closed position, but that is revealed when the first device housing is pivoted about the display relative to the second device housing from the closed position to an axially displaced open position. In still other embodiments, the electronic device will include three or more imagers.

In one or more embodiments, the at least one imager is operable with an augmented reality application or component. The augmented reality application or component can be operable to superimpose images, data, content, indicia, or other information upon images captured by the imager and presented on a display. When the electronic device is in an augmented reality mode of operation, images captured by the imager or stored within a memory of the electronic device can be presented on a display or other user interface with additional content superimposed thereon.

In one or more embodiments, the at least one imager is operable with an electronic image stabilization application, engine, or component. The electronic image stabilization application, engine, or component receives orientation determination signals from one or more inertial motion units and uses the received orientation data to compensate for imager shake, which can often occur when a person is capturing images while holding an electronic device in their hand. With electronic image stabilization, pitch and yaw, sometimes referred to as pan and slant, represent angular movement that can be corrected using orientation data received in the orientation determination signals from the inertial motion unit(s). Where included, the electronic image stabilization application, engine, or component continuously detects the movement and vibrations of the electronic device from the orientation determination signals received from the inertial motion unit(s) and automatically adjusts the frame of the image being captured so that successive frames—or even sensors capturing a single frame—see the same image details.

Where one imager is included in the electronic device, a person can capture images by activating the imager, directing its lens toward a subject or scene that they wish to capture, and delivering user input causing the imager to capture an image of the subject or scene. Alternatively, they can turn the electronic device around, directing the imager towards himself or herself to take a self image or "selfie." Where two imagers are included, the person can capture images by activating the front-facing imager, directing its lens toward a subject or scene that they wish to capture, and delivering user input causing the imager to capture an image of the subject or scene. The inclusion of a second imager allows the person to direct the second imager toward himself or herself to capture the selfie without turning the electronic device around. As noted above, in still other embodiments, the electronic device can include three or more imagers. Thus, electronic devices configured in accordance with embodiments of the disclosure can include multiple imagers at different positions.

In one or more embodiments, one or more processors of the electronic device detect the first device housing pivoting relative to the second device housing from the closed position to the axially displaced open position. In one or more embodiments, when this occurs, the one or more processors alter the orientation determination signals being delivered to various applications and components. This can occur in different ways, which include applying a correction factor to orientation determination signals reported from an inertial motion unit situated in the first device housing being flipped up, by changing from reporting orientation determination signals from the inertial motion unit in the second device housing or base to reporting orientation determination signals from the inertial motion unit situated in the first device housing, or combinations thereof. As explained above, this change in reporting can also be conditioned upon one or more of the imager or the augmented reality application or component being activated. Additional details, benefits, and advantages offered by embodiments of the disclosure will be described below with reference to the following figures. Still others will be obvious to those of ordinary skill in the art having the benefit of this disclosure.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other portable electronic devices as well, including tablet computers, gaming devices, and so forth. Still other types of electronic devices can be configured in accordance with one or more embodiments of the disclosure as will be readily appreciated by those of ordinary skill in the art having the benefit of this disclosure.

The electronic device 100 includes a first device housing 102 and a second device housing 103. In one or more embodiments, a hinge 101 couples the first device housing 102 to the second device housing 103. In one or more embodiments, the first device housing 102 is selectively pivotable about the hinge 101 relative to the second device housing 103. For example, in one or more embodiments the first device housing 102 is selectively pivotable about the hinge 101 between a closed position, shown and described below with reference to FIG. 2, a partially open position, shown and described below with reference to FIG. 3, and an open position, shown and described below with reference to FIGS. 4-5.

In one or more embodiments the first device housing 102 and the second device housing 103 are manufactured from a rigid material such as a rigid thermoplastic, metal, or composite material, although other materials can be used. Still other constructs will be obvious to those of ordinary skill in the art having the benefit of this disclosure. In the illustrative embodiment of FIG. 1, the electronic device 100 includes a single hinge 101. However, in other embodiments two or more hinges can be incorporated into the electronic device 100 to allow it to be folded in multiple locations.

While the illustrative electronic device 100 of FIG. 1 includes a hinge 101, embodiments of the disclosure are not so limited. In other embodiments, the electronic device 100 will be bendable, but will not include a hinge 101, such as when the first device housing 102 and the second device housing 103 are manufactured from bendable materials. In still other embodiments, the electronic device 100 can be bendable via a combination of hinge components and non-hinge components.

Illustrating by example, in another embodiment the electronic device 100 of FIG. 1 includes a single housing, which is flexible. In one embodiment, the housing may be manufactured from a malleable, bendable, or physically deformable material such as a flexible thermoplastic, flexible composite material, flexible fiber material, flexible metal, organic or inorganic textile or polymer material, or other materials. The housing could be formed from a single flexible housing member or from multiple flexible housing members.

In other embodiments, the housing could be a composite of multiple components. For instance, in another embodiment the housing could be a combination of rigid segments connected by hinges or flexible materials. Still other constructs will be obvious to those of ordinary skill in the art having the benefit of this disclosure.

The illustrative electronic device 100 of FIG. 1 includes multiple displays. A first display 105, also referred to as the interior display or the rear-facing display, is concealed when the first device housing 102 is pivoted about the hinge 101 relative to the second device housing 103 to a closed position. For example, the first display 105 is concealed in FIG. 2 below. This first display 105 is then revealed when the first device housing 102 is pivoted about the hinge 101 relative to the second device housing 103 from the closed position to an axially displaced open position. Thus, the first display 105 is revealed as the electronic device 100 transitions from the closed position of FIG. 2 to the open position of FIGS. 4-5.

In one or more embodiments, the electronic device 100 also includes at least a second display 120. In the illustrative embodiment of FIG. 1, the second display 120 can be referred to as an exterior display or front-facing display, as the second display 120 is exposed both when the first device housing 102 and the second device housing 103 are pivoted about the hinge 101 to the closed position or the axially displaced open position. Thus, the second display 120 is exposed both in the axially displaced open position of FIG. 1 and the closed position of FIG. 2. In one or more embodiments, each of the first display 105 and the second display 120 is a high-resolution display.

While shown coupled to the first device housing 102, it should be noted that the second display 120 could be coupled to either of the first device housing 102 or the second device housing 103. In other embodiments, the second display 120 can be coupled to the first device housing 102, while a third display (not shown) is coupled to the second device housing 103. Thus, electronic devices configured in accordance with embodiments of the disclosure can include displays situated at different positions.

As with the second display 120, the first display 105 can also be coupled to either or both of the first device housing 102 or the second device housing 103. In this illustrative embodiment, the first display 105 is coupled to both the first device housing 102 and the second device housing 103 and spans the hinge 101. In other embodiments, as will be described below with reference to FIG. 6, the "first" display can be two displays, with one coupled to the first device housing 102 and another coupled to the second device housing 103. In either case, this first display 105 is considered to be an "interior" display because it is concealed when the first device housing 102 and the second device housing 103 are in the closed position.

In one or more embodiments, either or both of first display 105 or second display 120 can be touch-sensitive. Where this is the case, users can deliver user input to one or both of the first display 105 or the second display 120 by delivering touch input from a finger, stylus, or other objects disposed proximately with the first display 105 or the second display 120.

In the illustrative embodiment of FIG. 1, since the first display 105 spans the hinge 101, it is configured to be flexible. For instance, in one embodiment the first display 105 is configured as an organic light emitting diode (OLED) display fabricated on a flexible plastic substrate. This allows the first display 105 to be flexible so as to deform when the first device housing 102 pivots about the hinge 101 relative to the second device housing 103. However, it should be noted that other types of displays would be obvious to those of ordinary skill in the art having the benefit of this disclosure. As will be described below with reference to FIG. 6, in other embodiments conventional, rigid displays can be disposed to either side of the hinge rather than using a flexible display.

In one or more embodiments, the first display 105 is configured as an OLED constructed on flexible plastic substrates to allow the first display 105 to bend in accordance with various bending radii. For example, some embodiments allow bending radii of between thirty and six hundred millimeters to provide a bendable display. Other substrates allow bending radii of around five millimeters to provide a display that is foldable through active bending. Other displays can be configured to accommodate both bends and folds. In one or more embodiments the first display 105 may be formed from multiple layers of flexible material such as flexible sheets of polymer or other materials.

In this illustrative embodiment, the first display 105 is coupled to the first device housing 102 and the second device housing 103. Accordingly, the first display 105 spans the hinge 101 in this embodiment. In one or more embodiments, the first display 105 can instead be coupled to one, or two, spring-loaded, slidable trays that situate within one or both of the first device housing 102 and the second device housing 103. The use of one or two slidable trays advantageously allows the first display 105 to be placed in tension when the electronic device 100 is in the open position. This causes the first display 105 to be flat, rather than wavy due to mechanical memory effects, when the electronic device 100 is in the open position.

Features can be incorporated into the first device housing 102 and/or the second device housing 103. Examples of such features include imager 106, which in this embodiment is an exterior or front facing imager satiated along the exterior 130 of the first device housing 102. The imager 106, which can be any number of types of image capture devices, has its lens situated such that it is directed away from a user who is holding the electronic device 100 and facing the first display 105 when the first device housing 102 has been pivoted about the hinge 101 relative to the second device housing 103 to the axially displaced open position shown in FIG. 1. This allows the imager 106 to receive light directed toward the electronic device 100 from a location in front of the user when the user is holding the electronic device 100 and facing the first display 105, which becomes exposed in the axially displaced open position of FIG. 1.

Instead of, or alternatively in addition to, the imager 106, a second, rear facing imager 121 can be positioned on the interior side of the electronic device 100 to receive light and images directed toward the first display 105. The second, rear facing imager 121 can be situated in the first device housing 102 or the second device housing 103. When a user is holding the electronic device 100 and looking at the first display, this second, rear facing imager 121 can be used to take a selfie without turning the electronic device 100 around.

While two imagers are shown in the illustrative embodiment of FIG. 1, it should be noted that embodiments of the disclosure can include additional imagers mounted in different positions that can be actuated to capture images from different angles. For example, in one or more embodiments the electronic device 100 can include a third imager 128 located on the second device housing 103 that is also positioned on the interior side of the electronic device 100 to receive light and images directed toward the first display 105. Likewise, the electronic device 100 can include a fourth imager 129 that is situated along the exterior side of the second device housing 103 such that it is directed away from a user who is holding the electronic device 100 and facing the first display 105 when the electronic device 100 is in the axially displaced open position of FIG. 1. Additional imagers can be added as necessary.

Moreover, the locations of the imagers can vary as well. Illustrating by example, if the electronic device includes only two imagers, e.g., first imager 106 and second imager 121, they could be repositioned. For instance, second imager 121 could be relocated to the position occupied by the third imager 128 in FIG. 1, or to another location. Similarly, first imager 106 could be relocated to the position occupied by the fourth imager 129, or to another location.

In one or more embodiments, the electronic device 100 includes at least one externally facing imager situated in the first device housing 102. Thus, in one or more embodiments, the electronic device 100 includes either multiple external imagers, e.g., the imager 106 and the imager 129, with at least one of those imagers situated in the first device housing 102 like imager 106 (albeit possibly at a different location on the exterior of the first device housing 102), or a single external imager, e.g., first imager 106, but situated in the first device housing 102, situated as shown or at another location along the exterior 130 of the first device housing 102. Having two externally facing imagers, e.g., imager 106 situated on the exterior 130 of the first device housing 102 and imager 129 situated on the exterior of the second device housing 103 advantageously allows both front facing and rear facing images to be captured when the first device housing 102 pivots about the hinge 101 relative to the second device housing 103 to the closed position of FIG. 2. However, in other embodiments, only imager 106 will be included on the exterior 130 of the first device housing 102 to simplify the hardware.

Similarly, in one or more embodiments the electronic device 100 includes at least one internally facing imager such as imager 121. While the interior of the first device housing 102 and the second device housing 103 can each include imagers, e.g., imager 121 and imager 128, since they face the same direction and are only exposed when the first device housing 102 pivots about the hinge 101 relative to the second device housing 103 to the axially displaced open position of FIG. 1, in many applications only a single imager, situated along the interior of either the first device housing 102 or the second device housing 103 will be included. Other configurations with other numbers and placements of imager will be obvious to those of ordinary skill in the art having the benefit of this disclosure.

Other examples of features that can be incorporated into the first device housing 102 and/or the second device housing 103 include an optional speaker port 107. While shown situated on the exterior of the electronic device 100 in FIG. 1, the optional speaker port 107 could also be placed on the interior side as well. In this illustrative embodiment, a user interface component 164, which may be a button or touch sensitive surface, can also be disposed along the exterior side of the second device housing 103. As noted, any of these features shown being disposed on the exterior side of the electronic device 100 could be located elsewhere, such as on the interior side or minor sides in other embodiments.

A block diagram schematic of the electronic device 100 is also shown in FIG. 1. In one or more embodiments, the block diagram schematic is configured as a printed circuit board assembly disposed within the first device housing 102, the second device housing 103, or in both the first device housing 102 and the second device housing 103. Various components can be electrically coupled together by conductors or a bus disposed along one or more printed circuit boards. It should be noted that the block diagram schematic includes many components that are optional, but which are included in an effort to demonstrate how varied electronic devices configured in accordance with embodiments of the disclosure can be.

Thus, it is to be understood that the block diagram schematic of FIG. 1 is provided for illustrative purposes only and for illustrating components of one electronic device 100 in accordance with embodiments of the disclosure. The block diagram schematic of FIG. 1 is not intended to be a complete schematic diagram of the various components required for an electronic device 100. Therefore, other electronic devices in accordance with embodiments of the disclosure may include various other components not shown in FIG. 1, or may include a combination of two or more components or a division of a particular component into two or more separate components, and still be within the scope of the present disclosure.

In one embodiment, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. In one or more embodiments, each of the application processor and the auxiliary processor(s) is operable with the other components, modules, applications, and engines of the electronic device 100. A storage device, such as memory 113, can optionally store the executable software code used by the one or more processors 112 during operation.

In one or more embodiments, the electronic device 100 also includes one or more image capture application modules 111. In one or more embodiments, each imager, e.g., imager 106 and imager 121, include a separate image capture application module, which is why additional image capture application modules are shown in dashed line in FIG. 1. In other embodiments, the electronic device 100 will include a single image capture application module that is operable with multiple imagers.

In one or more embodiments, the image capture application module(s) 111 identify actuation of one or more imagers. For example, where the electronic device 100 includes one image capture application module 111 operable with two imagers, the image capture application module 111 can identify actuation of imager 106 and/or second imager 121 and/or image capture operations. For example, the image capture application module 111 can detect user actuation of the imager 106 and/or second imager 121.

The image capture application module 111 can also include a facial recognition module that analyzes images captured by the imager 106 and/or second imager 121 to identify facial characteristics present in images captured by the imager 106 and/or second imager 121. In one or more embodiments, in response to the image capture application module 111 identifying these or other image capture operations, the one or more processors can cause the presentation of image capture assistance content as will be described in more detail below.

In one or more embodiments, each imager, e.g., imager 106 and second imager 121, is operable with an electronic image stabilization engine 104. The electronic image stabilization engine 104 receives orientation determination signals 110,118 from one or more inertial motion units 108,109 and uses the received orientation data communicated by the orientation determination signals 110,118 to compensate for vibrations, motion, and shaking experienced by the imager 106 and/or second imager 121. Such vibrations, motion, or shaking can occur when a person is capturing images with the imager 106 or second imager 121 while holding the electronic device 100 in their hand.

In one or more embodiments, the electronic image stabilization engine 104 processes the orientation data communicated by the orientation determination signals 110,118 to correct the angular movement experienced by the imager 106 or second imager 121. In one or more embodiments, the electronic image stabilization engine 104 continuously detects the movement and vibrations of the electronic device 100 from the orientation determination signals 110,118 received from the inertial motion unit(s) and automatically adjusts the frame of the image being captured so that successive frames—or even sensors capturing a single frame—see the same image details. As with the image capture application module 111, in one or more embodiments, each imager, e.g., imager 106 and imager 121, include a separate electronic image stabilization engine, as indicated in the dashed lines of FIG. 1. In other embodiments, the electronic device 100 will include a single electronic image stabilization engine that is operable with multiple imagers.

In one or more embodiments, each imager, e.g., imager 106 and second imager 121, is operable with an augmented reality engine 166. The augmented reality engine 166 is operable to superimpose images, data, content, indicia, or other information upon images captured by the imager 106 or second imager 121 when those images are presented on a display, be it the interior display 105 or exterior display 120. When the electronic device 100 is in an augmented reality mode of operation, images captured by the imager 106 or second imager 121, or stored within the memory 113 of the electronic device 100, can be presented on a display 105 or other user interface with additional content superimposed thereon by the augmented reality engine 166. As with the image capture application module 111, in one or more embodiments, each imager, e.g., imager 106 and imager 121, include a separate augmented reality application, as indicated in the dashed lines of FIG. 1. In other embodiments, the electronic device 100 will include a single augmented reality application that is operable with multiple imagers.

In one or more embodiments, each imager operable with the imager capture application module 111, e.g., imager 106 and/or imager 121, can be simply a conventional imager. For example, these imagers can comprise a two-dimensional imager 150 configured to receive at least one image of objects within an environment of the electronic device 100. In one embodiment, these imagers comprise a two-dimensional Red-Green-Blue (RGB) imager. In another embodiment, these imagers comprise a two-dimensional infrared imager. Other types of imagers suitable for use as imager 106, imager 121, or other imagers of the electronic device 100 will be obvious to those of ordinary skill in the art having the benefit of this disclosure.

In other embodiments, these imagers can be more complex. Illustrating by example, in another embodiment one or more of imager 106, imager 121, or the other imagers of the electronic device 100 also include a depth imager 151. Where included, the depth imager 151 can take a variety of forms. In a first embodiment, the depth imager 151 comprises a pair of imagers separated by a predetermined distance, such as three to four images. This "stereo" imager works in the same way the human eyes do in that it captures images from two different angles and reconciles the two to determine distance.

In another embodiment, the depth imager 151 employs a structured light laser. The structured light laser projects tiny light patterns that expand with distance. These patterns land on a surface, such as a user's face, and are then captured by an imager. By determining the location and spacing between the elements of the pattern, three-dimensional mapping can be obtained.

In still another embodiment, the depth imager 151 comprises a time of flight device. Time of flight three-dimensional sensors emit laser or infrared pulses from a photodiode array. These pulses reflect back from a surface, such as the user's face. The time it takes for pulses to move from the photodiode array to the surface and back determines distance, from which a three-dimensional mapping of a surface can be obtained. Regardless of embodiment, where included the depth imager 151 adds a third "z-dimension" to the x-dimension and y-dimension defining the two-dimensional image captured by the two-dimensional imager 150, thereby enhancing the image capture features of the electronic device 100.

The imagers can also be operable with one or more proximity sensors 152. As with the depth imager 151, where included, the one or more proximity sensors 152 can take various forms. In one or more embodiments, the one or more proximity sensors 152 fall in to one of two camps: active proximity sensors and "passive" proximity sensors. Either the proximity detector components or the proximity sensor components can be generally used for distance determination, changes in distance between a source, e.g., a user of the electronic device, and the electronic device 100 and another object. As used herein, a "proximity sensor component" comprises a signal receiver only that does not include a corresponding transmitter to emit signals for reflection off an object to the signal receiver. By contrast, proximity detector components include a signal emitter and a corresponding signal receiver, which constitute an "active IR" pair.

In one embodiment, the one or more proximity sensors 152 simply comprise a proximity sensor component. In another embodiment, the one or more proximity sensors 152 comprise a simple thermopile. In another embodiment, the one or more proximity sensors 152 comprise an infrared imager that captures the amount of thermal energy emitted by an object. In still other embodiments, the one or more proximity sensors 152 comprise a proximity detector component. Of course, combinations of these components can be used as the one or more proximity sensors 152. Moreover, other types of proximity sensors suitable for use with the electronic device 100 will be obvious to those of ordinary skill in the art having the benefit of this disclosure.

In one or more embodiments, the image capture application module(s) 111 can be operable with an environmental analyzer 153. The environmental analyzer 153 can be configured to process an image or depth scan of an object and determine whether the object matches predetermined criteria by comparing the image or depth scan to one or more predefined authentication references stored in memory 113.

In this illustrative embodiment, the electronic device 100 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11, and other forms of wireless communication such as infrared technology. The communication circuit 114 can include wireless communication circuitry, one of a receiver, a transmitter, or transceiver, and one or more antennas 115.

In one embodiment, the one or more processors 112 can be responsible for performing the primary functions of the electronic device 100. For example, in one embodiment the one or more processors 112 comprise one or more circuits operable with one or more user interface devices, which can include the display 105, to present, images, video, or other presentation information to a user. The executable software code used by the one or more processors 112 can be configured as one or more modules 116 that are operable with the one or more processors 112. Such modules 116 can store instructions, control algorithms, logic steps, and so forth.

In one embodiment, the one or more processors 112 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100.

The application layer can be responsible for executing application service modules. The application service modules may support one or more applications or "apps." These applications can optionally be applications that use orientation data of the first device housing 102, the second device housing 103, and/or the electronic device 100 as input. Such orientation-based applications 154 can be stored in the memory 113 of the electronic device 100 in one or more embodiments.

Examples of applications shown in FIG. 1 include an a navigation application 123, which may include an augmented reality application, or make use of the augmented reality engine 166 of the electronic device 100, to superimpose identifiers on objects, such as buildings, landmarks, streets, houses, or other objects captured in images by the imager 106 or second imager 121. Other applications include an electronic mail application 124, an augmented reality application 126 that launches the augmented reality engine 166, and an image capture application 127 that launches the imager 106, the second imager 121, and/or any other imagers included with the electronic device 100.

These applications are illustrative only, as numerous others will be obvious to those of ordinary skill in the art having the benefit of this disclosure. The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

In one embodiment, the electronic device 100 optionally includes one or more hinge alignment sensors 117 configured to detect an angular alignment between the first device housing 102 and the second device housing 103 about the hinge 101, i.e., where the hinge 101 serves as the pivot fulcrum for the first device housing 102 and the second device housing 103. The one or more hinge alignment sensors 117 can include one or more flex sensors that are operable with the one or more processors 112 to detect a bending operation that causes the first device housing 102 to pivot about the hinge 101 relative to the second device housing 103, thereby transforming the electronic device 100 into a deformed geometry, such as that shown in FIGS. 2-3. The inclusion of the one or more hinge alignment sensors 117, be they flex sensors or another type of sensor, is optional. In some embodiment the one or more hinge alignment sensors 117 will not be included.

Where configured as flex sensors, the one or more hinge alignment sensors 117 can be configured as passive resistive devices manufactured from a material with an impedance that changes when the material is bent, deformed, or flexed. By detecting changes in the impedance as a function of resistance, the one or more processors 112 can use the flex sensors to detect bending of the first device housing 102 about the hinge 101 relative to the second device housing 103. In one or more embodiments, each flex sensor comprises a bi-directional flex sensor that can detect flexing or bending in two directions. In one embodiment, the one or more flex sensors have an impedance that increases in an amount that is proportional with the amount it is deformed or bent. Other types of sensors suitable for use as hinge alignment sensors will be obvious to those of ordinary skill in the art having the benefit of this disclosure.

In other embodiments, the one or more hinge alignment sensors 117 detect angles between the first device housing 102 and the second device housing 103 in other ways. For example, the one or more hinge alignment sensors 117 can detect the first device housing 102 pivoting about the hinge 101 relative to the second device housing 103 from the axially displaced open position to the closed position by detecting the inner surfaces of the first device housing 102 and the second device housing 103 abutting. For instance, a magnet can be placed in the first device housing 102, while a magnetic sensor is placed in the second device housing 103, or vice versa. The magnetic sensor could be Hall-effect sensor, a giant magnetoresistance effect sensor, a tunnel magnetoresistance effect sensor, an anisotropic magnetoresistive sensor, or other type of sensor.

In still other embodiments, the one or more hinge alignment sensors 117 can comprise an inductive coil placed in the first device housing 102 and a piece of metal placed in the second device housing 103, or vice versa. When the metal is in close proximity to the coil, the one or more hinge alignment sensors 117 detect the first device housing 102 and the second device housing 103 in a first position. By contrast, when the metal is farther away from the coil, the one or more hinge alignment sensors 117 can detect the first device housing 102 and the second device housing 103 being in a second position, and so forth. Other examples of sensors suitable for use as the one or more hinge alignment sensors 117 will be obvious to those of ordinary skill in the art having the benefit of this disclosure.

In other embodiments the one or more hinge alignment sensors 117 can be omitted, as the inertial motion unit 108 situated in the first device housing 102, and, where included, the inertial motion unit 109 situated in the second device housing 103, can be used to compare motion sensor readings from each inertial motion unit 108,109 to track the relative movement and/or position of the first device housing 102 relative to the second device housing 103, as well as the first device housing 102 and the second device housing 103 relative to the gravitational direction 144. This data can be used to determine and or track the state and position of the first device housing 102 and the second device housing 103 directly as they pivot about the hinge 101, as well as their orientation with reference to a gravitational direction 144.

In one or more embodiments, the electronic device 100 includes an audio input/processor 131. The audio input/processor 131 can include hardware, executable code, and speech monitor executable code in one embodiment. The audio input/processor 131 can include, stored in memory 113, basic speech models, trained speech models, or other modules that are used by the audio input/processor 131 to receive and identify voice commands that are received with audio input captured by an audio input/processor 133, one example of which is a microphone. In one embodiment, the audio input/processor 133 can include a voice recognition engine. Regardless of the specific implementation utilized in the various embodiments, the audio input/processor 133 can access various speech models to identify speech commands in one or more embodiments.

In one embodiment, the audio input/processor 133 is configured to implement a voice control feature that allows the electronic device 100 to function as a voice assistant device, which may be configured as a voice assistant engine. In one or more embodiments, the voice assistant engine is a digital assistant using voice recognition, speech synthesis, and natural language processing to receive audio input comprising a voice command from a source, determine the appropriate response to the voice command, and then deliver the response in the form of audio output in response to receiving the audio input from the source. When so configured, a user can cause the emanation of the audio input from their mouth to cause the one or more processors 112 of the electronic device 100 to execute a control operation.

Various sensors 135 can be operable with the one or more processors 112. A first example of a sensor that can be included with the various sensors 135 is a touch sensor. The touch sensor can include a capacitive touch sensor, an infrared touch sensor, resistive touch sensors, or another touch-sensitive technology.

Another example of a sensor 135 is a geo-locator that serves as a location detector 136. In one embodiment, location detector 136 is able to determine location data of the electronic device 100. Location can be determined by capturing the location data from a constellation of one or more earth orbiting satellites, or from a network of terrestrial base stations to determine an approximate location. The location detector 136 may also be able to determine location by locating or triangulating terrestrial base stations of a traditional cellular network, such as a CDMA network or GSM network, or from other local area networks, such as Wi-Fi networks.

As noted above, in one or more embodiments the electronic device 100 includes one or more features or applications that depend upon orientation determination signals 110,118 that received from an inertial motion unit 108,109. Accordingly, in one or more embodiments the electronic device 100 includes at least one inertial motion unit 108,109. In one embodiment, the electronic device 100 includes only a single inertial motion unit 108 that is situated in the first device housing 102. In another embodiment, the electronic device 100 optionally includes a second inertial motion unit 109 that is situated in the second device housing 103. Additional inertial motion units can be included as necessitated by a particular application.

In one or more embodiments, each inertial motion unit 108,109 comprises a combination of one or more accelerometers 137,138 and one or more gyroscopes 139,140, and optionally one or more magnetometers 141,142, to determine the orientation, angular velocity, and/or specific force of one or both of the first device housing 102 or the second device housing 103. When included in the electronic device 100, these inertial motion units 108,109 can be used as orientation sensors to measure the orientation of one or both of the first device housing 102 or the second device housing 103 in three-dimensional space 143. Similarly, the inertial motion units 108,109 can be used as orientation sensors to measure the motion of one or both of the first device housing 102 or second device housing 103 in three-dimensional space 143. The inertial motion units 108,109 can be used to make other measurements as well.

In one or more embodiments, the inertial motion unit 108 situated in the first device housing 102, and, where included, the inertial motion unit 109 situated in the second device housing 103, can be configured as orientation detectors that determines the orientation and/or movement of one or both of the first device housing 102 or the second device housing 103 in three-dimensional space 143. Illustrating by example, each inertial motion unit 108,109 can determine the spatial orientation of one or both of the first device housing 102 or the second device housing 103 in three-dimensional space 143 by, for example, detecting a gravitational direction 144 using an accelerometer 137,138. In addition to, or instead of, an accelerometer 137,138, magnetometers 141,142 can be included to detect the spatial orientation of the electronic device relative to the earth's magnetic field. Similarly, one or more gyroscopes 139,140 can be included to detect rotational orientation of the electronic device 100.

Motion of the electronic device 100 can similarly be detected. The accelerometers 137,138, gyroscopes 139,140, and/or magnetometers 141,142 can be used as a motion detector in an electronic device 100. Using the accelerometers 137,138 as an example, such devices can be included to detect motion of the electronic device 100. Additionally, the accelerometers 137,138 can be used to sense some of the gestures of the user, such as one talking with their hands, running, or walking.

The inertial motion units 108,109 can also be used to determine the spatial orientation of an electronic device 100 in three-dimensional space 143 by detecting a gravitational direction 144. Similarly, the gyroscopes 139,140 can be included to detect rotational motion of the electronic device 100.

In one or more embodiments, each inertial motion unit 108,109 determines an orientation of the device housing in which it is situated in three-dimensional space. For example, where only one inertial motion unit 108 is included in the first device housing 102, this inertial motion unit 108 is configured to determine an orientation, which can include measurements of azimuth, plumb, tilt, velocity, angular velocity, acceleration, and angular acceleration, of the first device housing 102. Similarly, where two inertial motion units are included, with one inertial motion unit 108 being situated in the first device housing 102 and another inertial motion unit 109 being situated in the second device housing 103, each inertial motion unit 108,109 determines the orientation of its respective device housing. Inertial motion unit 108 can determine measurements of azimuth, plumb, tilt, velocity, angular velocity, acceleration, angular acceleration, and so forth of the first device housing 102, while inertial motion unit 108 can determine measurements of azimuth, plumb, tilt, velocity, angular velocity, acceleration, angular acceleration, and so forth of the second device housing 103.

In one or more embodiments, each inertial motion unit 108,109 delivers these orientation measurements to the one or more processors 112 in the form of orientation determination signals 110,118. Said differently, in one or more embodiments each inertial motion unit 108,109 outputs an orientation determination signal 110,118 comprising the determined orientation of its respective device housing. Thus, inertial motion unit 108 outputs orientation determination signal 110, which comprises the determined orientation of the first device housing 102, while inertial motion unit 109, where included, outputs orientation determination signal 118, which comprises the determined orientation of the second device housing 103.

In one or more embodiments, the orientation determination signals 110,118 are delivered to the one or more processors 112, which report the determined orientations to the various modules, components, and applications operating on the electronic device 100. In one or more embodiments, the one or more processors 112 can be configured to deliver a composite orientation that is an average or other combination of the orientation of orientation determination signal 110 and the orientation of orientation determination signal 118. In other embodiments, the one or more processors 112 are configured to deliver one or the other, i.e., either the orientation of orientation determination signal 110 or the orientation of orientation determination signal 118 to the various modules, components, and applications operating on the electronic device 100. In one or more embodiments, the one or more processors 112 select which orientation from which orientation determination signal 110,118 to report based upon at least one predefined condition of the electronic device 100, as will be explained in more detail below.

In one or more embodiments, an inertial motion unit adjustment engine 145 is operable with inertial motion unit 108. Embodiments of the disclosure contemplate that the inertial motion unit 108 will make different determinations of orientation depending upon the condition of the electronic device 100. For example, when the first device housing 102 is pivoted about the hinge 101 relative to the second device housing 103 to the closed position of FIG. 2, the inertial motion unit 108 will read two axes, which are the Z-axis and the Y-axis of FIG. 1, with a different sign convention than when the first device housing 102 is pivoted about the hinge 101 relative to the second device housing 103 to the axially displaced open position shown in FIG. 1. This is in addition to the fact that the inertial motion unit 108 will measure a different elevation, and potentially a different series of coordinates and orientation, when in the axially displaced open position as compared to the closed position. Accordingly, the inertial motion unit adjustment engine 145 is included to apply at least one correction factor 147 to the orientation determination signal 110 received from the inertial motion unit 108 in certain conditions, such as when the electronic device 100 is in a predefined condition.

In one or more embodiments, the inertial motion unit adjustment engine 145 is configured as a hardware module operable with the one or more processors 112. In other embodiments, the inertial motion unit adjustment engine 145 is configured as software or firmware operating on the one or more processors 112. In still other embodiments, the inertial motion unit adjustment engine 145 is configured as a hardware component integrated within the one or more processors 112. Other configurations for the inertial motion unit adjustment engine 145 will be obvious to those of ordinary skill in the art having the benefit of this disclosure.

In one or more embodiments, the inertial motion unit adjustment engine 145 is operable with an inertial motion unit adjustment engine trigger 146. Where included, the inertial motion unit adjustment engine trigger 146 activates the inertial motion unit adjustment engine 145 when the electronic device 100 is in a predefined condition. The corollary of the inertial motion unit adjustment engine trigger 146 is the optional inertial motion unit adjustment engine bypass 149, which is optional and, where included, is operable to deactivate the inertial motion unit adjustment engine 145 in the absence of a predefined condition being experienced by the electronic device 100.

Examples of such predefined conditions of the electronic device 100 include when the first device housing 102 is pivoted about the hinge 101 relative to the second device housing 103 to the closed position, when the first device housing 102 pivots about the hinge 101 relative to the second device housing 103 to the axially displaced open position, when the first device housing 102 is pivoting about the hinge 101 relative to the second device housing 103 between the closed position and the axially displaced open position, when a predefined angle occurs between the first device housing 102 and the second device housing 103 about the hinge, when the imager, be it imager 106, imager 121, or another imager, is activated or transitioned to an active mode of operation operable to capture images, when the augmented reality engine 166 is actively operating, and so forth. Other examples of predefined conditions will be described below. Still others will be obvious to those of ordinary skill in the art having the benefit of this disclosure.

In one or more embodiments, the inertial motion unit adjustment engine 145 is activated by the inertial motion unit adjustment engine trigger 146 when the electronic device 100 experiences at least one predefined condition. In one or more embodiments, the inertial motion unit adjustment engine 145, when activated, applies at least one correction factor 147 to the orientation determination signal 110 received from the inertial motion unit 108 in the first device housing 102 to create a modified orientation determination signal 148.

For example, the correction factor 147 may invert two axes of the three-dimensional space 143 when the first device housing 102 is pivoted about the hinge 101 relative to the second device housing 103 to the closed position when the predefined condition of the electronic device 100 is that of being in the closed position. Said differently, when the orientation determination signal 110 received from the inertial motion unit 108 situated in the first device housing 102 comprises orientation measurements along the three dimensions of three-dimensional space 143, which are shown in FIG. 1 as the X-axis, Y-axis, and Z-axis, in one or more embodiments the inertial motion unit adjustment engine 145 applies at least one correction factor 147 to the orientation determination signal 110 causing an inversion of the orientation measurements of at least two dimensions of the three-dimensional space 143, which are the non-hinge parallel axes, which are the Y-axis and Z-axis of FIG. 1.

Where the predefined condition of the electronic device 100 is a predefined angle occurring between the first device housing 102 and the second device housing 103 about the hinge 101, in one or more embodiments the inertial motion unit adjustment engine 145, when activated, applies a correction factor 147 in the form of a rotation matrix that is a predefined function of the predefined angle between the first device housing 102 and the second device housing 103. Thus, if the at least one predefined angle includes the angles of one degree to 180 degrees, inclusive, the inertial motion unit adjustment engine 145 may apply a correction factor 147 in the form of a rotation matrix for each angle as the first device housing 102 pivots about the hinge 101 from the closed position to the axially displaced open position to compensate for measurement changes due to the angle between the device housings. Of course, combinations of inversions and rotation matrices can be used as the at least one correction factor 147 as well.

Where the predefined condition of the electronic device 100 comprises at least one predefined angle between the first device housing 102 and the second device housing 103 about the hinge 101, in combination with an imager, be it imager 106 or imager 121, being active, in one or more embodiments the inertial motion unit adjustment engine 145, when activated, applies the at least one correction factor 147, be it in the form of the inversion, the rotation matrix, or combinations thereof, only when the imager is in an active mode of operation and the at least one angle occurs between the first device housing 102 and the second device housing 103 about the hinge 101.

Where the predefined condition of the electronic device 100 comprises at least one predefined angle between the first device housing 102 and the second device housing 103 about the hinge 101, in combination with an augmented reality application, be it the augmented reality engine 166 of the electronic device 100, an augmented reality feature of the navigation application 123, or another augmented reality application, being active, in one or more embodiments the inertial motion unit adjustment engine 145, when activated, applies the at least one correction factor 147, be it in the form of the inversion, the rotation matrix, or combinations thereof, only when the augmented reality application is in an active mode of operation and the at least one angle occurs between the first device housing 102 and the second device housing 103 about the hinge 101.

Embodiments of the disclosure contemplate that this activation of the inertial motion unit adjustment engine 145 can introduce discontinuity into the stream of orientation determination data of the orientation determination signal 110 being delivered to the applications operating on the one or more processors 112. This discontinuity can result from any number of factors, including sudden changes in the orientation determination data in the orientation determination signal 110 due to inaccuracies in measuring alignment between the first device housing 102 and the second device housing 103 about the hinge 101, latency in measurement of the same, or latency in detecting the electronic device 100 experiencing the at least one predefined condition. To assist the applications operating on the one or more processors 112 in processing orientation determination data found in the orientation determination signal 110, in one or more embodiments the one or more processors 112 and/or the inertial motion unit adjustment engine 145 perform a transition identification operation on the orientation determination signal 110 during such transitions.

The transition identification operation can one or both of smooth the data that the one or more processors 112 report to the applications in the orientation determination signal 110 and/or notify the applications that the accuracy of the data may be less than when the electronic device 100 is in a steady state. Illustrating by example, in one embodiment the inertial motion unit adjustment engine and/or the one or more processors perform the transition identification operation by applying a filter to the orientation data sent in the orientation determination signal 110 as they are delivered to the applications during the transition.

In another embodiment, the inertial motion unit adjustment engine and/or the one or more processors can perform the transition identification operation by intentionally interrupting the orientation determination data of the orientation determination signal 110. In one or more embodiments, this interruption comprises dropping orientation determination data samples of the orientation determination signal 110, thereby providing an indicator to the applications that the instantaneous orientation data is in transition. In still another embodiment, the inertial motion unit adjustment engine and/or one or more processors can perform the transition identification operation by introducing data into the orientation determination signal 110, with that data indicating that the orientation determination measurements of the orientation determination signal 110 are in transition and may not have their normal, steady state accuracy while the introduced data is in in the orientation data signal 110. Other techniques for performing the transition identification operation to the orientation data signal 110 to assist the applications in interpreting the orientation determination data of the orientation determination signal 110 will be obvious to those of ordinary skill in the art having the benefit of this disclosure.

Just as the inertial motion unit adjustment engine 145 can be activated, optionally by the inertial motion unit adjustment engine trigger 146, in response to a predefined condition of the electronic device 100, it can be deactivated as well. Illustrating by example, where the predefined condition of the electronic device 100 comprises either the first device housing 102 being pivoted about the hinge 101 relative to the second device housing 103 to the closed position or a predefined angle occurring between the first device housing 102 and the second device housing 103 about the hinge, in one or more embodiments the inertial motion unit adjustment engine 145 can be deactivated when the first device housing 102 and the second device housing 103 pivot about the hinge 101 to the axially displaced open position. Thus, the inertial motion unit adjustment engine 145 may apply a correction factor 147 in the form of an inversion when the first device housing 102 and the second device housing 103 pivot about the hinge 101 to the closed position, and may apply other correction factors 147 in the form of a rotation matrices when the first device housing 102 and the second device housing 103 are pivoting between, say one degree and 179 degrees, the inertial motion unit adjustment engine 145 may be deactivated when the first device housing 102 and second device housing 103 pivot about the hinge 101 to the axially displaced open position. In other embodiments, the opposite will be true, with the inertial motion unit adjustment engine 145 being activated between one degree and the axially displaced open position, but being deactivated when the first device housing 102 and second device housing 103 pivot about the hinge 101 to the closed position.

As was the case when the inertial motion unit adjustment engine 145 was activated, embodiments of the disclosure contemplate that deactivation of the inertial motion unit adjustment engine 145 can also introduce discontinuity into the stream of orientation determination data of the orientation determination signal 110 being delivered to the applications operating on the one or more processors 112. Accordingly, to assist the applications operating on the one or more processors 112 in processing orientation determination data found in the orientation determination signal 110, in one or more embodiments the one or more processors 112 and/or the inertial motion unit adjustment engine 145 perform a transition identification operation on the orientation determination signal 110 when the inertial motion unit adjustment engine 145 is deactivated, just as was the case when the inertial motion unit adjustment engine 145 was activated. The transition identification operation can one or both smooth the data that the one or more processors 112 report to the applications in the orientation determination signal 110 and/or notify the applications that the accuracy of the data may be less than when the electronic device 100 is in a steady state.

As before, examples of transition identification operations include filtering to the orientation data sent in the orientation determination signal 110 as they are delivered to the applications during the transition, intentionally interrupting the orientation determination data of the orientation determination signal 110, such as by dropping orientation determination data samples of the orientation determination signal 110, thereby providing an indicator to the applications that the instantaneous orientation data is in transition, and/or introducing data into the orientation determination signal 110, with that data indicating that the orientation determination measurements of the orientation determination signal 110 are in transition and may not have their normal, steady state accuracy while the introduced data is in in the orientation data signal 110. Other techniques for performing the transition identification operation to the orientation data signal 110 to assist the applications in interpreting the orientation determination data of the orientation determination signal 110 will be obvious to those of ordinary skill in the art having the benefit of this disclosure.

In addition to activation of the inertial motion unit adjustment engine 145 and application of the at least one correction factor 147 to the orientation determination signal 110 received from the inertial motion unit 108, reporting of orientation data by the one or more processors 112, the inertial motion unit adjustment engine 145, the inertial motion units 108,109, or combinations thereof can be affected by predefined conditions of the electronic device as well. When reporting is changed due to a predefined condition, in one or more embodiments the one or more processors 112 and/or the inertial motion unit adjustment engine 145 perform a transition identification operation on the orientation determination signal 110 when the inertial motion unit adjustment engine 145 is deactivated. The transition identification operation can one or both smooth the data that the one or more processors 112 report to the applications in the orientation determination signal 110 and/or notify the applications that the accuracy of the data may be less than when the electronic device 100 is in a steady state.

Illustrating by way of a simple example, in one or more embodiments the electronic device 100 includes the first inertial motion unit 108 situated in the first device housing 102, and the second inertial motion unit 109 situated in the second device housing 103. The first inertial motion unit 108 determines a first device housing orientation in three-dimensional space 143 and outputs the first device orientation in the first device housing orientation determination signal 110. Similarly, the second inertial motion unit 109 determines a second device housing orientation in three-dimensional space 143, and outputs the second device housing orientation in a second device housing orientation determination signal 118. Where included, the inertial motion unit adjustment engine 145, which is operable with the first inertial motion unit 108 and the second inertial motion unit 109, can be activated, optionally by an inertial motion unit adjustment engine trigger 146, when the electronic device 100 experiences at least one predefined condition.

In one or more embodiments, one or more processors 112 receive the first device housing orientation and the second device housing orientation in the form of the orientation determination signals 110,118 from each inertial motion unit 108,109. In one or more embodiments, the one or more processors 112 report a composite orientation determination signal stream, which can be an average or other combination of the orientation determination signal 110 from the first inertial motion unit 108 and the orientation determination signal 118 from the second inertial motion unit 109, to various applications requiring the same that are actively running on the one or more processors 112.

In one or more embodiments, when the first device housing 102 pivots about the hinge 101 relative to the second device housing 103 to the closed position, the one or more processors 112 report orientation determination signals only from the first inertial motion unit 108 situated in the first device housing 102 to the applications, but after applying the correction factor 147 causing the two non-hinged axes to be inverted. By contrast, in one or more embodiments when the first device housing 102 pivots about the hinge 101 relative to the second device housing 103 to the axially displaced open position, the inertial motion unit adjustment engine 145 is deactivated. Accordingly, when the electronic device 100 is in this condition the one or more processors 112 report the orientation determination signals only from the inertial motion unit 108 situated in the first device housing 102 directly without inversion in one or more embodiments.

In one or more embodiments, when both the first device housing 102 is pivoted about the hinge 101 relative to the second device housing 103 to the axially displaced open position, and the imager, be it image 106, imager 121, or another imager, is transitioned to an active mode of operation and/or is performing image capture operations, the one or more processors 112 report orientation determination signals only from the inertial motion unit 108 situated in the first device housing 102. By contrast, when the first device housing 102 is pivoted about the hinge 101 relative to the second device housing 103 to the closed position, the one or more processors 112 report orientation determination signals only from the inertial motion unit situated 109 in the second device housing 103, even when the imager is active in one or more embodiments. Alternatively, the one or more processors 112 can report composite orientation determination signals from both the inertial motion unit 108 situated in the first device housing 102 and the inertial motion unit 109 situated in the second device housing 103, but with the two non-hinge axes inverted, as previously described.

In one or more embodiments, when both the first device housing 102 is pivoted about the hinge 101 relative to the second device housing 103 to the axially displaced open position, and an augmented reality application, e.g., the augmented reality engine 166, is transitioned to an active mode of operation and/or is performing augmented reality operations, the one or more processors 112 report orientation determination signals only from the inertial motion unit 108 situated in the first device housing 102. By contrast, when the first device housing 102 is pivoted about the hinge 101 relative to the second device housing 103 to the closed position, the one or more processors 112 report orientation determination signals only from the inertial motion unit 109 situated in the second device housing 103, even when the augmented reality application is active in one or more embodiments. Alternatively, the one or more processors 112 can report composite orientation determination signals from both the inertial motion unit 108 situated in the first device housing 102 and the inertial motion unit 109 situated in the second device housing 103, but with the two non-hinge axes inverted.

In one or more embodiments, when the first device housing 102 is pivoted about the hinge 101 relative to the second device housing 103 to the closed position, the one or more processors 112 only report orientation determination signals from the inertial motion unit 109 situated in the second device housing 103. In one or more embodiments, this reporting of only orientation determination signals from the inertial motion unit 109 situated in the second device housing 103 only occurs when the imager and/or the augmented reality function is inactive.

In still another embodiment, the one or more processors 112 report the second device orientation extracted from the second housing orientation determination signal 118 to one or more applications operating on the one or more processors 112 when the inertial motion unit adjustment engine 145 is deactivated. By contrast, the one or more processors 112 report the first device housing orientation extracted from the first device housing orientation determination signal 110 to the one or more applications—instead of the second device housing orientation extracted from the second device housing orientation determination signal 118—when the inertial motion unit adjustment engine 145 is activated in response to the electronic device 100 experiencing a predefined condition.

Illustrating by example, where the predefined condition comprises the imager, be it imager 106, imager 121, or another imager, being in an active mode of operation, optionally in combination with the first device housing 102 and second device housing 103 being pivoted about the hinge 101 to the axially displaced open position or another predefined angle, in one or more embodiments the one or more processors 112 report the second device orientation extracted from the second housing orientation determination signal 118 to one or more applications operating on the one or more processors 112 when the imager is deactivated, or not in an active mode of operation. By contrast, the one or more processors 112 may report the first device housing orientation extracted from the first device housing orientation determination signal 110 to the one or more applications—instead of the second device housing orientation extracted from the second device housing orientation determination signal 118—when the imager is in the active mode of operation.

Similarly, where the predefined condition comprises an augmented reality application, such as the augmented reality engine 166 or another augmented reality application, actively being in operation on the one or more processors 112, optionally in combination with one or both of the first device housing 102 and second device housing 103 being pivoted about the hinge 101 to the axially displaced open position or another predefined angle and/or the imager being in the active mode of operation, in one or more embodiments the one or more processors 112 report the second device orientation extracted from the second housing orientation determination signal 118 to one or more applications operating on the one or more processors 112 when any of these conditions is not occurring. By contrast, the one or more processors 112 may report the first device housing orientation extracted from the first device housing orientation determination signal 110 to the one or more applications—instead of the second device housing orientation extracted from the second device housing orientation determination signal 118—when each of these conditions, where required to satisfy the predefined conditions, exists. Examples of these modes of operation will be illustrated and explained in more detail with reference to FIGS. 8-12 below.

Continuing with the description of the block diagram schematic of FIG. 1, still other sensors 135 can be included with the electronic device 100 as well. For instance, another example of a sensor 135 is a force sensor. Where included, the force sensor can take various forms. For example, in one embodiment, the force sensor comprises resistive switches or a force switch array configured to detect contact with either the display or the housing of an electronic device. The array of resistive switches can function as a force-sensing layer, in that when contact is made with either the surface of the display or the housing of the electronic device, changes in impedance of any of the switches may be detected. The array of switches may be any of resistance sensing switches, membrane switches, force-sensing switches such as piezoelectric switches, or other equivalent types of technology. In another embodiment, the force sensor can be capacitive. In yet another embodiment, piezoelectric sensors can be configured to sense force as well. For example, where coupled with the lens of the display, the piezoelectric sensors can be configured to detect an amount of displacement of the lens to determine force. The piezoelectric sensors can also be configured to determine force of contact against the housing of the electronic device 100 rather than the display 105,120.

In one embodiment, the one or more processors 112 may generate commands or execute control operations based on information received from the various sensors, including the inertial motion unit(s) 108,109, the one or more hinge alignment sensors 117 (where included), or the other sensors 135. Illustrating by example, in one or more embodiments the one or more processors 112 or the inertial motion unit adjustment engine trigger 146 transition the inertial motion unit adjustment engine 145 from a deactivated state to an active state in response to a predefined condition of the electronic device 100 detected by one or more of the inertial motion unit(s) 108,109, the one or more hinge alignment sensors 117 (where included), or the other sensors 135, alone or in combination.

Other components 155 operable with the one or more processors 112 can include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components 132 such as the one or more loudspeakers 134, the ultrasound transducers (where included), or other alarms and/or buzzers. The other components 155 can also include a mechanical output component such as vibrating or motion-based mechanisms.

The other components 155 can optionally include a barometer operable to sense changes in air pressure due to elevation changes or differing pressures of the electronic device 100. The other components 155 can also optionally include a light sensor that detects changes in optical intensity, color, light, or shadow in the environment of an electronic device 100. An infrared sensor can be configured to detect thermal emissions from an environment about the electronic device 100. Similarly, a temperature sensor can be configured to monitor temperature about the electronic device 100.

In one or more embodiments, the one or more processors 112 can define one or more process engines, one example of which is the inertial motion unit adjustment engine 145. As described above, each process engine can be a component of the one or more processors 112, operable with the one or more processors 112, defined by the one or more processors 112, and/or integrated into the one or more processors 112. Other configurations for these engines, including as software or firmware modules operable on the one or more processors 112, will be obvious to those of ordinary skill in the art having the benefit of this disclosure.

For instance, in addition to the inertial motion unit adjustment engine 145, a context engine 156 can be operable with the various sensors to detect, infer, capture, and otherwise determine persons and actions that are occurring in an environment about the electronic device 100. Where included one embodiment of the context engine 156 can be configured to determine assessed contexts and frameworks using adjustable algorithms of context assessment employing information, data, and events. These assessments may be learned through repetitive data analysis. Alternatively, a user may employ the user interface, e.g., the display 105, to enter various parameters, constructs, rules, and/or paradigms that instruct or otherwise guide the context engine 156 in detecting multi-modal social cues, emotional states, moods, and other contextual information. The context engine 156 can comprise an artificial neural network or other similar technology in one or more embodiments.

In one or more embodiments, the context engine 156 is operable with the one or more processors 112. In some embodiments, the one or more processors 112 can control the context engine 156. In other embodiments, the context engine 156 can operate independently, delivering information gleaned from detecting multi-modal social cues, emotional states, moods, and other contextual information to the one or more processors 112. The context engine 156 can receive data from the various sensors. In one or more embodiments, the one or more processors 112 are configured to perform the operations of the context engine 156.

It is to be understood that FIG. 1 is provided for illustrative purposes only and for illustrating components of one electronic device 100 in accordance with embodiments of the disclosure, and is not intended to be a complete schematic diagram of the various components required for an electronic device. Therefore, other electronic devices in accordance with embodiments of the disclosure may include various other components not shown in FIG. 1, or may include a combination of two or more components or a division of a particular component into two or more separate components, and still be within the scope of the present disclosure.

Figure 2:
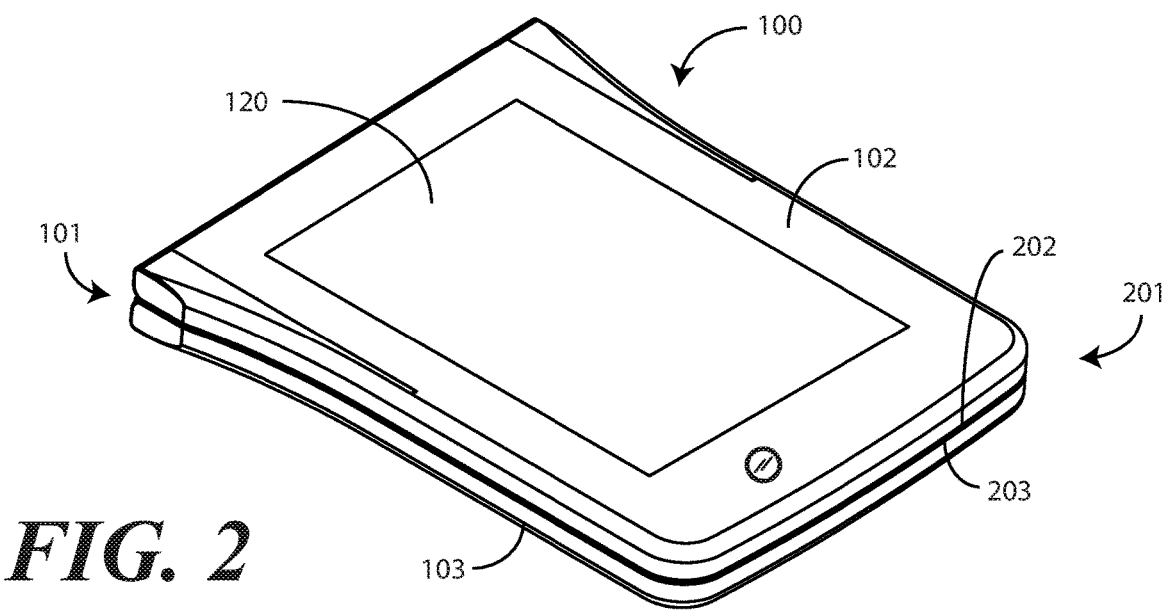
FIG. 2 illustrates one explanatory electronic device with a first device housing and a second device housing pivoted to a closed position in accordance with one or more embodiments of the disclosure.

Turning now to FIG. 2, illustrated therein is the electronic device 100 in a closed state. In this state, the first device housing 102 has been pivoted about the hinge 101 toward the second device housing 103 to a closed position 201. When in the closed position 201, a front surface 202 of the first device housing 102 abuts a front surface 203 of the second device housing 103. When in the closed position 201, the exterior display, i.e., second display 120, is visible, exposed, and accessible by a user. By contrast, when in the closed position 201, the interior display, i.e., first display (105), is concealed, is not visible, and is inaccessible by a user. Effectively, in the closed position 201 the first device housing 102 and the second device housing 103 are analogous to clam shells that have been shut by the claim, thereby giving rise to the "clamshell" style of device.

Figure 3:
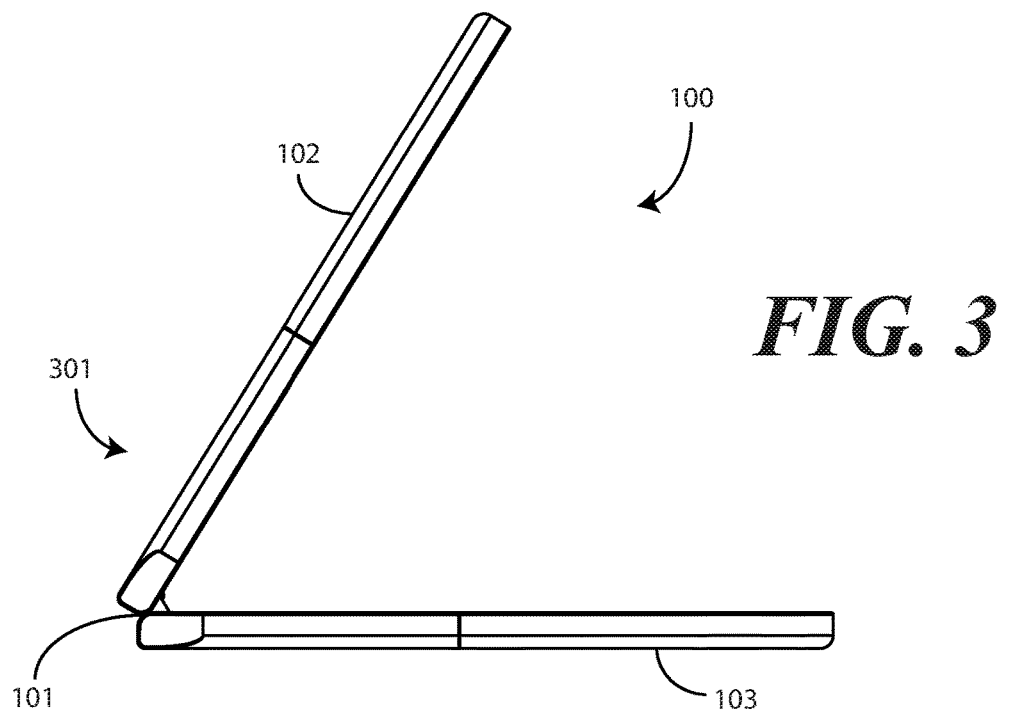
FIG. 3 illustrates one explanatory electronic device with a first device housing and a second device housing pivoted to a partially open position in accordance with one or more embodiments of the disclosure.

Turning now to FIG. 3, the electronic device 100 is shown being transitioned from the closed position (201) of FIG. 2 to a partially opened position. Specifically, the first device housing 102 is pivoting about the hinge 101 away from the second device housing 103 toward, but not fully yet to, an open position where the first device housing 102 is axially displaced about the hinge 101 from the second device housing 103. The position shown in FIG. 3 can be referred to as a "tent position" 301.

Figures 4, 5:
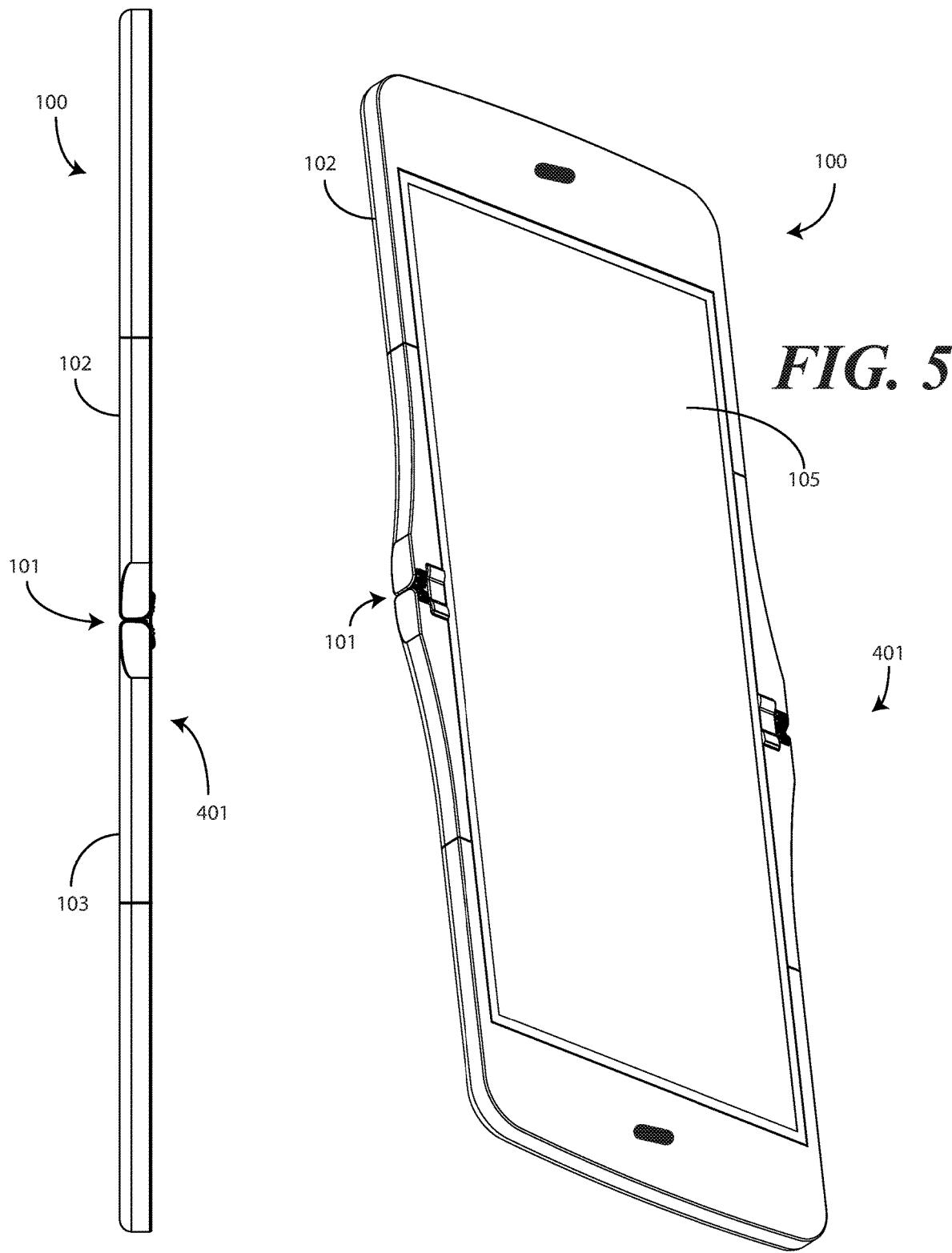
FIG. 4 illustrates one explanatory electronic device with a first device housing and a second device housing pivoted to an axially displaced open position in accordance with one or more embodiments of the disclosure.
FIG. 5 illustrates another view of one explanatory electronic device with a first device housing and a second device housing pivoted to an axially displaced open position in accordance with one or more embodiments of the disclosure.

Turning now to FIGS. 4 and 5, illustrated therein is the electronic device 100 in an axially displaced open position 401 where the first device housing 102 is rotated about the hinge 101 so as to become axially displaced from the second device housing 103. In the axially displaced open position, the first device housing 102 is rotated about the hinge 101 so as to be 180-degrees out of phase with the second device housing 103 such that the first device housing 102 and the second device housing 103 effectively define a plane. In other embodiments, the first device housing 102 and the second device housing 103 may have a small deviation from a plane. For example, the first device housing 102 and second device housing 103 may define an angle of between 170 and 175 degrees in one embodiment.

As shown in FIG. 5, the first display 105, being flexible, has been transitioned from a bent position into the elongated flat position. In one or more embodiments this occurs due to the action of one or more slidable trays (mentioned above), which can be disposed within one or both of the first device housing 102 and the second device housing 103.

Figure 6:
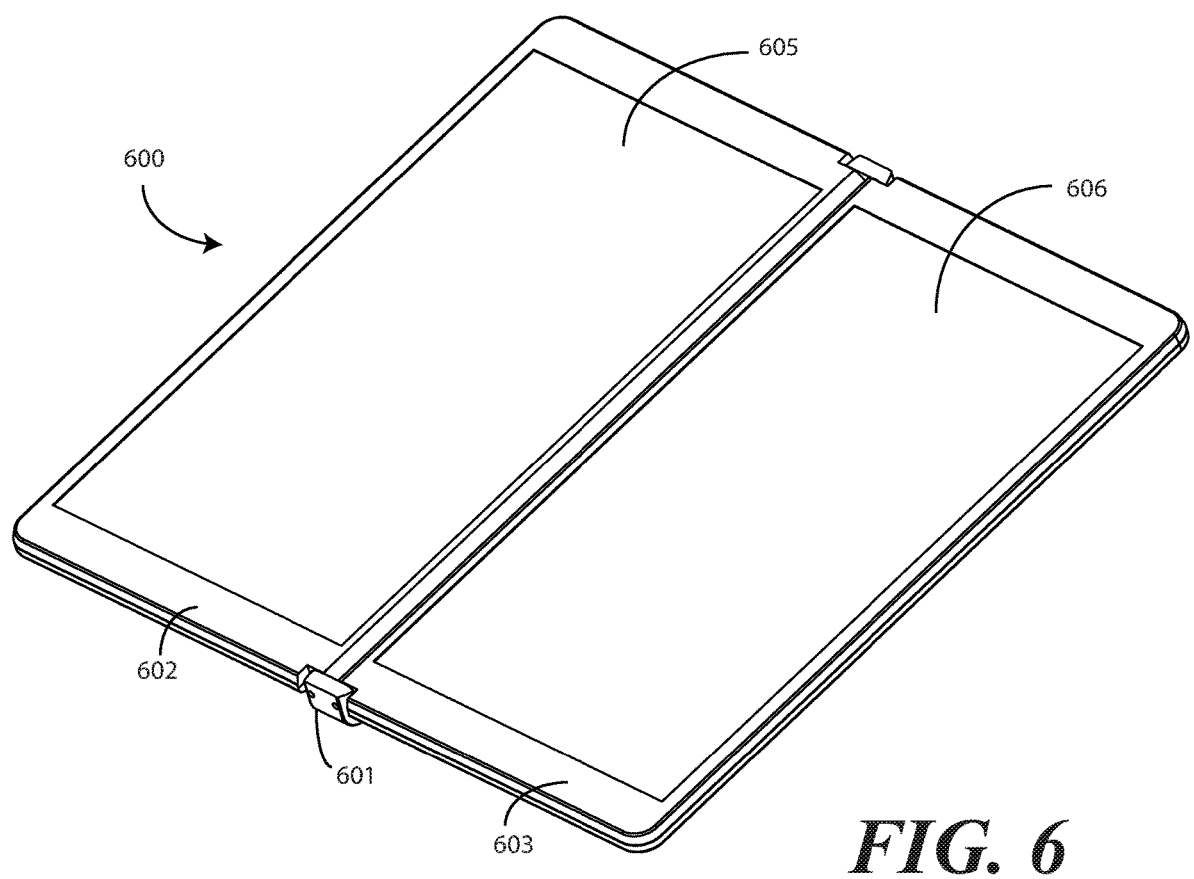
FIG. 6 illustrates another explanatory electronic device with a first device housing and a second device housing pivoted to an axially displaced open position in accordance with one or more embodiments of the disclosure.

Turning now to FIG. 6, illustrated therein is another electronic device 600 configured in accordance with one or more embodiments of the disclosure. The electronic device 600 of FIG. 6 is similar to that of FIG. 1, in that it includes a first device housing 602 and a second device housing 603, and a hinge 601. The hinge 601 couples the first device housing 602 to the second device housing 603. The first device housing 602 is pivotable about the hinge 601 relative to the second device housing 603 between an axially displaced open position and a closed position, as previously described.

In one or more embodiments, the electronic device 600 also includes an exterior display attached to one of the first device housing 602 or the second device housing 603, as previously described above with reference to second display (120) of FIG. 1. However, rather than having a flexible display, in this embodiment the electronic device 600 includes a first display 605 coupled to the first device housing 602 and a second display 606 coupled to the second device housing 603. Thus, in addition to separating the first device housing 602 from the second device housing 603, the hinge 601 separates the first display 605 from the second display 606 as well.

As with the electronic device (100) of FIGS. 1-5, in one or more embodiments the electronic device 600 of FIG. 6 includes at least one inertial motion unit (108,109) and at least one imager (106,121). In one embodiment, the electronic device 600 includes only a single inertial motion unit (108) that is situated in the first device housing 602, along with an imager (106), just as was the case with the electronic device (100) of FIG. 1. In another embodiment, the electronic device 600 optionally includes a second inertial motion unit (109) that is situated in the second device housing 603. Additional inertial motion units can be included as necessitated by a particular application, as can additional imagers.

Figure 7:
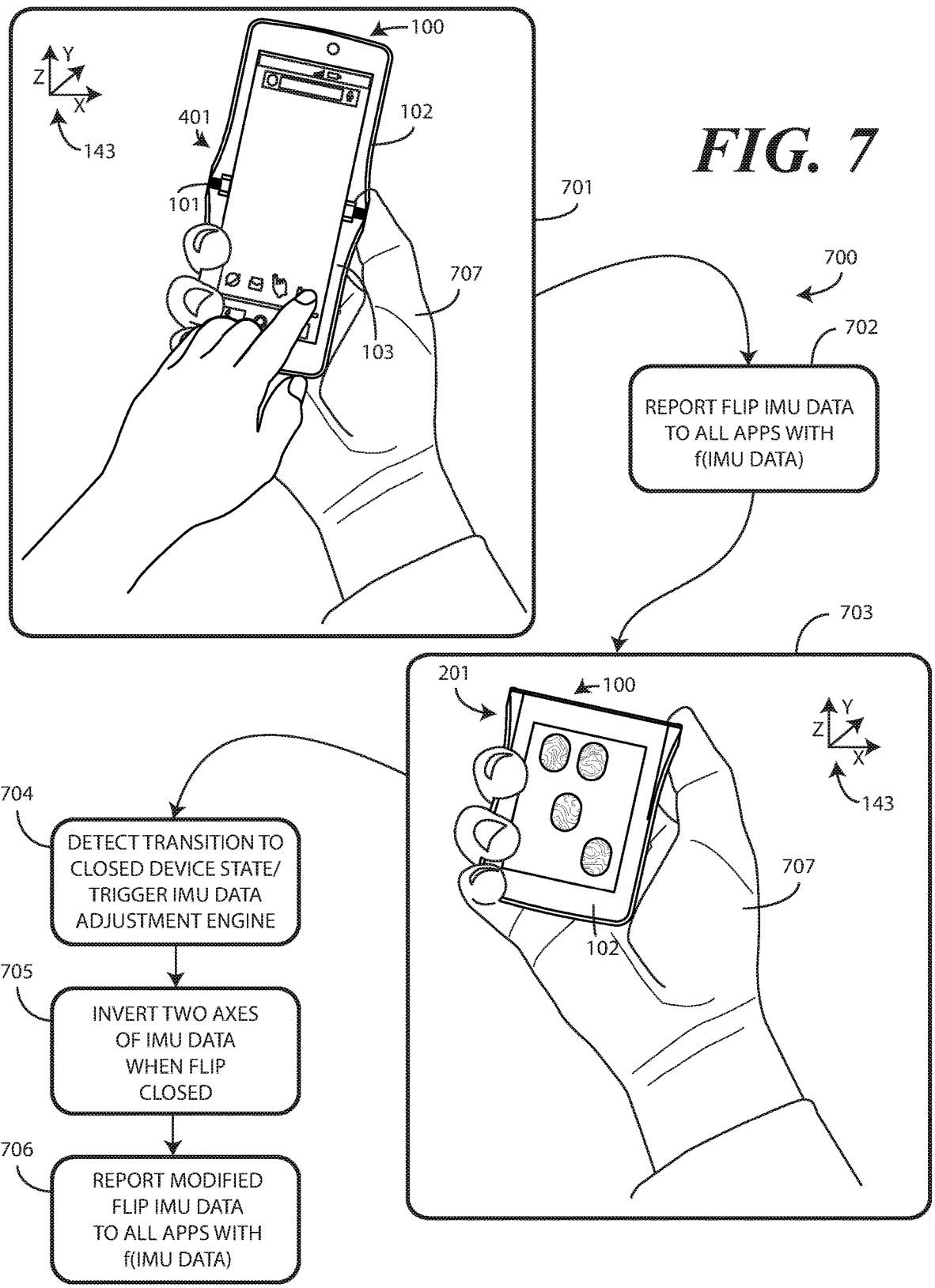
FIG. 7 illustrates one explanatory electronic device and one or more method steps in accordance with one or more embodiments of the disclosure.

Now that various hardware components of various electronic devices have been described, attention will be turned to methods of using electronic devices in accordance with one or more embodiments of the disclosure. Turning now to FIG. 7, illustrated therein is one explanatory method 700 for an electronic device configured in accordance with one or more embodiments of the disclosure. Alternate methods will be described thereafter with reference to subsequent figures.

At step 701 is a user 707 holding the electronic device 100 of FIG. 1 while the electronic device 100 is in the axially displaced open position 401. As previously described, the electronic device 100 includes a first device housing 102 and a second device housing 103, as well as a hinge 101 coupling the first device housing 102 to the second device housing 103. The first device housing 102 is pivotable about the hinge 101 relative to the second device housing 103 between the axially displaced open position 401 of step 701 and the closed position 201 of step 703.

The electronic device 100 includes at least one inertial motion unit (108), situated in the first device housing 102. In one embodiment, the electronic device 100 includes only one inertial motion unit, namely, the inertial motion unit (108) carried by the first device housing 102. In other embodiments, the electronic device 100 optionally includes a second inertial motion unit (109) situated in the second device housing (103).

The at least one inertial motion unit (108) determines an orientation of the first device housing 102 in three-dimensional space 143, and outputs the determined orientation in an orientation determination signal (110). The electronic device 100 also includes an inertial motion unit adjustment engine (145), which is activated by at least one predefined condition of the electronic device 100. When the inertial motion unit adjustment engine (145) is activated, by an inertial motion unit adjustment engine trigger (146), one or more processors (112) of the electronic device 100, or by other techniques or mechanisms, the inertial motion unit adjustment engine (145) applies at least one correction factor (147) to the orientation determination signal (110) to create a modified orientation determination signal (148).

At step 701, the electronic device 100 includes one or more processors (112) that are operable with the at least one inertial motion unit (108) and the inertial motion unit adjustment engine (145). In one or more embodiments, the one or more processors (112) are configured to report the determined orientation from the orientation determination signal (110) (or the orientation determination signal (110) directly) to one or more applications operating on the one or more processors (112), e.g., the electronic image stabilization engine (104), the augmented reality engine (166), navigation applications, and so forth, when the inertial motion unit adjustment engine (145) is deactivated. By contrast, the one or more processors (112) are configured to report the modified orientation from the orientation determination signal (110) (or the modified orientation determination signal (148) directly) to the one or more applications—instead of the orientation determination signal (110)—when the inertial motion unit adjustment engine (145) is activated.

At step 701, the one or more processors (112), optionally using the one or more hinge alignment detectors (117), the at least one inertial motion unit (108), or another sensor (135), detect that the electronic device 100 is in the axially displaced open position 401. In this illustration, the user 707 is activating an imager (106) carried by the first device housing 102, which is disposed on an exterior side (130) of the first device housing 102, facing away from the user. In so doing, the user 707 can employ the imager (106) to capture images, optionally employing the electronic image stabilization engine (104) to smooth images or video from any distortion caused by the user's hand shaking and/or the augmented reality engine (166) to superimpose content upon any captured images, such as may be beneficial when those images are used in a navigation application.

At step 702, the one or more processors (112) of the electronic device 100 report, to any applications relying upon the orientation determinations from an inertial motion unit, the determined orientation from the orientation determination signal (110) (or the orientation determination signal (110) directly). In this illustrative embodiment, the orientation of the orientation determination signal (110) comprises orientation measurements along the three dimensions of the three-dimensional space 143. In this illustration, this includes at least an orientation measurement along the Z-axis, an orientation measurement along the X-axis, and an orientation measurement along the Y-axis.

In the illustrative example of FIG. 7, the at least one predefined condition comprises the first device housing 102 being pivoted about the hinge 101 relative to the second device housing 103 to the closed position 201 of step 703. Thus, at step 702, since the electronic device 100 is in the axially displaced open position 401, the inertial motion unit adjustment engine (145) is deactivated. Accordingly, the one or more processors (112) report determined orientation from the orientation determination signal (110) (or the orientation determination signal (110) directly) to the requisite applications without any modification from the inertial motion unit adjustment engine (145).

At step 703, the user 707 transitions the electronic device 100 from the axially displaced open position 410 of step 701 to the closed position 201. Specifically, the user 700 has pivoted the first device housing 102 relative to the second device housing (hidden behind the first device housing 102 at step 703) about the hinge 101 from the axially displaced open position 401 of step 701 to the closed position 201 of step 703.

At step 704, the one or more processors (112), optionally using the one or more hinge alignment detectors (117), the at least one inertial motion unit (108), or another sensor (135), detect that the electronic device 100 is now in the closed position 201, which is the predefined condition used to activate the inertial motion unit adjustment engine (145) in this example. In one or more embodiments, upon detecting this change, the one or more processors (112), the inertial motion unit adjustment engine trigger (146), or another component (155) activates the inertial motion unit adjustment engine (145) at step 704. In one or more embodiments the one or more processors 112 and/or the inertial motion unit adjustment engine 145 perform a transition identification operation on the orientation determination signal 110 when the inertial motion unit adjustment engine 145 is activated, as previously described, to can one or both smooth the data that the one or more processors 112 report to the applications in the orientation determination signal 110 and/or notify the applications that the accuracy of the data may be less than when the electronic device 100 is in a steady state.

Since the inertial motion unit adjustment engine (145) is now active, at step 705 it modifies the orientation of the orientation determination signal (110) output by the inertial motion unit (108) by applying at least one correction factor (147). In this illustration, since the first device housing 102 has now been pivoted about 180-degrees out of phase from where it was in step 701, in one or more embodiments the inertial motion unit adjustment engine (145) applies a correction factor (147) causing an inversion of the orientation measurements of two dimensions of the three-dimensions of the three-dimensional space 143.

In one or more embodiments, the inertial motion unit adjustment engine (145) applies a correction factor (147) causing an inversion of the two "non-hinge aligned" axes, which are the Z-axis and the Y-axis. Said differently, by flipping the first device housing 102 upside down when transitioning the electronic device 100 from the axially displaced open position 401 to the closed position 201, this inverts the at least one inertial motion unit (108) situated in the first device housing 102. Accordingly, measurements of the Z-axis and the Y-axis are inverted. When the inertial motion unit adjustment engine (145) applies the at least one correction factor inverting the orientation measurements of two dimensions of the three dimensions of the three-dimensional space to create a modified orientation determination signal (148), the orientation determinations are corrected.

At step 706, the one or more processors (112) of the electronic device 100 then report the modified orientation from the orientation determination signal (110) (or the modified orientation determination signal (148) directly) to the one or more applications—instead of the orientation determination signal (110)—at step 706. The one or more processors (112) continue to do this, in one or more embodiments, as long as the inertial motion unit adjustment engine (145) is activated, which means as long as the electronic device 100 is in the closed position 201 of step 703. When the electronic device 100 transitions out of the closed position 201, the optional inertial motion unit adjustment engine bypass (149), the one or more processors (112), another sensor (135), or another component (155) can deactivate the inertial motion unit adjustment engine (145) in this example.

Thus, to summarize the method 700 of FIG. 7, in this example the one or more processors (112) always report the orientation from the orientation determination signal (110) or the orientation determination signal (110) itself to applicable applications, but with the inertial motion unit adjustment engine (145) inverting two axes of the three-dimensional space 143 when the electronic device 100 is in the closed position 201. Accordingly, in this illustrative embodiment the inertial motion unit adjustment engine (145) is deactivated when the first device housing 102 and the second device housing 103 pivot about the hinge 101 to the axially displaced open position 401.

Figure 8:
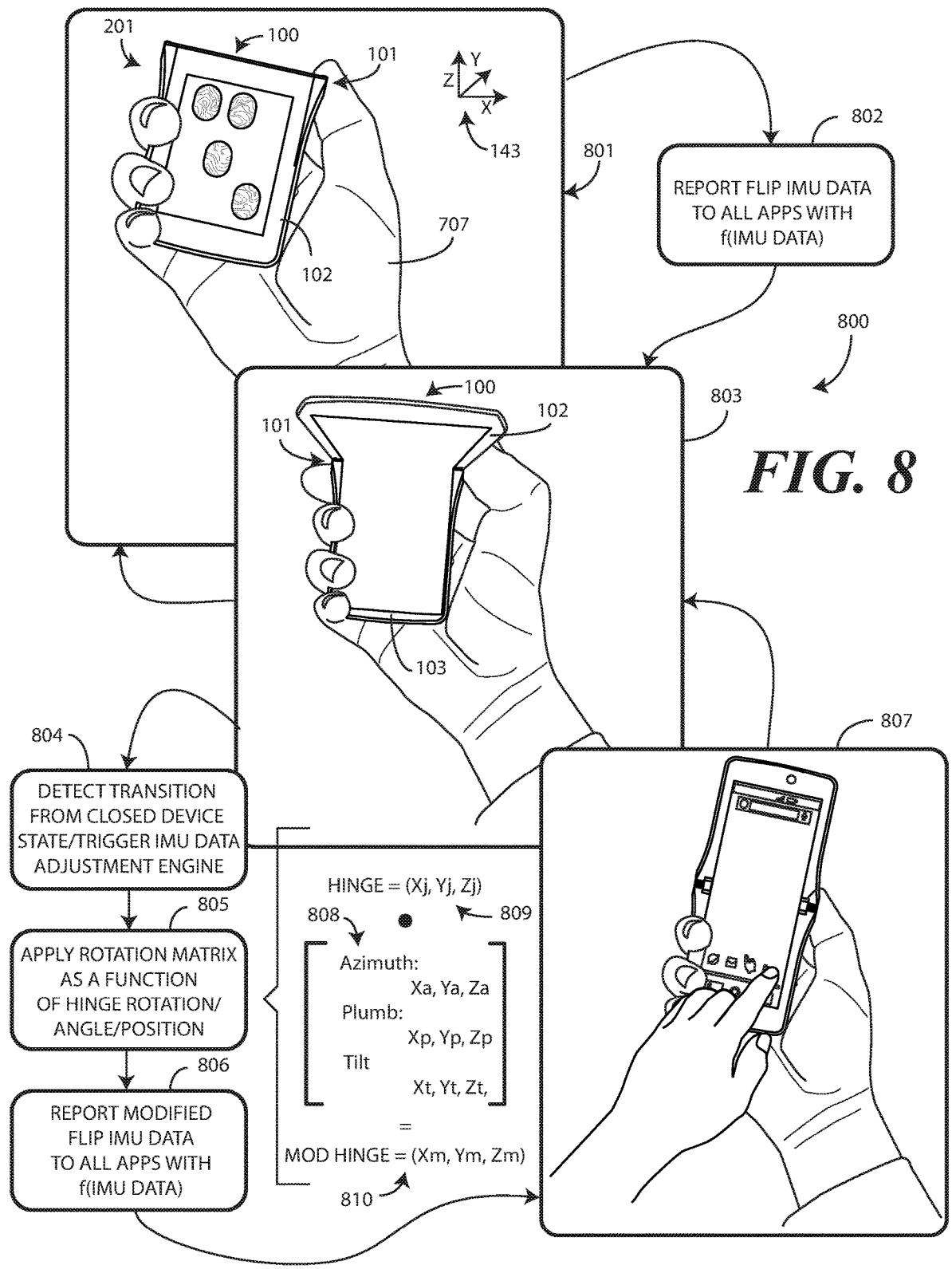
FIG. 8 illustrates one or more explanatory method steps in accordance with one or more embodiments of the disclosure.

Turning now to FIG. 8, illustrated therein is another method 800 in accordance with one or more embodiments of the disclosure. At step 801 is a user 707 holding the electronic device 100 of FIG. 1 while the electronic device 100 is in the closed position. The electronic device 100 includes a first device housing 102 and a second device housing (hidden by the first device housing 102 at step 801), as well as a hinge 101 coupling the first device housing 102 to the second device housing. The first device housing 102 is pivotable about the hinge 101 relative to the second device housing 103 between the closed position 201 of step 801 and the axially displaced open position 401 of step 803, through various angles that may exist between the first device housing 102 and second device housing 103 about the hinge 101, as shown at step 802.

As with the method (700) of FIG. 7, in FIG. 8 the electronic device 100 includes at least one inertial motion unit (108), situated in the first device housing 102. In one embodiment, the electronic device 100 includes only one inertial motion unit, namely, the inertial motion unit (108) carried by the first device housing 102. In other embodiments, the electronic device 100 optionally includes a second inertial motion unit (109) situated in the second device housing (103).

The at least one inertial motion unit (108) determines an orientation of the first device housing 102 in three-dimensional space 143, and outputs the determined orientation in an orientation determination signal (110). The electronic device 100 also includes an inertial motion unit adjustment engine (145), which is activated by at least one predefined condition of the electronic device 100. When the inertial motion unit adjustment engine (145) is activated, by an inertial motion unit adjustment engine trigger (146), one or more processors (112) of the electronic device 100, or by other techniques or mechanisms, the inertial motion unit adjustment engine (145) applies at least one correction factor (147) to the orientation determination signal (110) to create a modified orientation determination signal (148).

At step 801, the electronic device 100 again includes one or more processors (112) that are operable with the at least one inertial motion unit (108) and the inertial motion unit adjustment engine (145). In one or more embodiments, the one or more processors (112) are configured to report the determined orientation from the orientation determination signal (110) (or the orientation determination signal (110) directly) to one or more applications operating on the one or more processors (112), e.g., the electronic image stabilization engine (104), the augmented reality engine (166), navigation applications, and so forth, when the inertial motion unit adjustment engine (145) is deactivated. By contrast, the one or more processors (112) are configured to report the modified orientation from the orientation determination signal (110) (or the modified orientation determination signal (148) directly) to the one or more applications—instead of the orientation determination signal (110)—when the inertial motion unit adjustment engine (145) is activated.

At step 801, the one or more processors (112), optionally using the one or more hinge alignment detectors (117), the at least one inertial motion unit (108), or another sensor (135), detect that the electronic device 100 is in the closed position 201. At step 802, the one or more processors (112) of the electronic device 100 report, to any applications relying upon the orientation determinations from an inertial motion unit (108), the determined orientation from the orientation determination signal (110) (or the orientation determination signal (110) directly). In this illustrative embodiment, the orientation of the orientation determination signal (110) comprises orientation measurements along the three dimensions of the three-dimensional space 143. In this illustration, this includes at least an orientation measurement along the Z-axis, an orientation measurement along the X-axis, and an orientation measurement along the Y-axis.

In the illustrative example of FIG. 8, the at least one predefined condition comprises at least one predefined angle occurring between the first device housing 102 and the second device housing 103 about the hinge 101. This at least one predefined angle could be a single angle, such as zero degrees, 30 degrees, 45 degrees, 60, degrees, 90 degrees, 120 degrees, 135 degrees, 150 degrees, or 180 degrees. In other embodiments, the at least one predefined angle could include a plurality of predefined angles that span a range. For instance, in the illustrative embodiment of FIG. 8, the at least one predefined angle comprises the angles of one degree through 180 degrees, inclusive.

Since the electronic device 100 is in the closed position 201 at step 801, which is not one of the at least one predefined angles, the inertial motion unit adjustment engine (145) is deactivated at step 801. Accordingly, at step 802, the one or more processors (112) report the determined orientation from the orientation determination signal (110) (or the orientation determination signal (110) directly) to the requisite applications without any modification from the inertial motion unit adjustment engine (145).

At step 803, the user 707 has partially transitioned the electronic device 100 from the closed position of step 801 to a tent position 301, where the first device housing 102 is oriented at about 90 degrees relative to the second device housing 103 about the hinge 101. Since this angle is between one and 180, it constitutes one of the at least one predefined angles that should activate or otherwise trigger the inertial motion unit adjustment engine (145).

Since the electronic device 100 is now experiencing the predefined condition at step 803, at step 804 the one or more processors (112), optionally using the one or more hinge alignment detectors (117), the at least one inertial motion unit (108), or another sensor (135), detect that the one angle of the at least one predefined angle is occurring between the first device housing 102 and the second device housing 103. This means that the predefined condition used to activate the inertial motion unit adjustment engine (145) is occurring at step 803 of this example. In one or more embodiments, upon detecting this predefined condition occurring, the one or more processors (112), the inertial motion unit adjustment engine trigger (146), or another component (155) activates the inertial motion unit adjustment engine (145) at step 804. In one or more embodiments the one or more processors 112 and/or the inertial motion unit adjustment engine 145 perform a transition identification operation on the orientation determination signal 110 when the inertial motion unit adjustment engine 145 is activated, as previously described, to can one or both smooth the data that the one or more processors 112 report to the applications in the orientation determination signal 110 and/or notify the applications that the accuracy of the data may be less than when the electronic device 100 is in a steady state.

Since the inertial motion unit adjustment engine (145) is now active, at step 805 it modifies the orientation of the orientation determination signal (110) output by the inertial motion unit (108) by applying at least one correction factor (147). In this illustration, the at least one correction factor (147) comprises a rotation matrix 808 that is applied to the orientation measurements 809 along the three dimensions of the three-dimensional space 143 to create modified orientation measurements 810 along the three dimensions of the three-dimensional space 143. In this illustrative embodiment, the rotation matrix 808 is a function of the angle occurring between the first device housing 102 and the second device housing 103 about the hinge 101, and corrects for changes in the orientation measurements 809 along the three dimensions of the three-dimensional space 143 that occur as the inertial motion unit (108) situated in the first device housing 102 moves from its position in step 801 to its position in step 803, and on to its position in step 807. Since the rotation matrix 808 is a function of the angle between the first device housing 102 and the second device housing 103, in one or more embodiments each angle will include a corresponding rotation matrix that is different from other rotation matrices. An angle of one degree between the first device housing 102 and the second device housing 103 would correspond to a first rotation matrix, while an angle of two degrees between the first device housing 102 and the second device housing 103 would correspond to a second rotation matrix, and so forth.

If, for example, the angle between the first device housing 102 and the second device housing 103 is one degree, the inertial motion unit adjustment engine may (145) apply a rotational matrix 808 adjusting the tilt, plumb, or azimuth measurements set forth in the orientation measurements 809 along the three dimensions of the three-dimensional space 143 included in the orientation determination signals (110) received from the inertial motion unit (108) with a first rotational matrix. Similarly, when the angle between the first device housing 102 and the second device housing 103 is two degrees, the inertial motion unit adjustment engine (145) may apply another rotational matrix adjusting the tilt, plumb, or azimuth measurements in the orientation measurements 809 along the three dimensions of the three-dimensional space 143 included in the orientation determination signals (110) received from the inertial motion unit (108) with a second rotational matrix, and so forth. Thus, the inertial motion unit adjustment engine (145) can transform the orientation determination signals (110) received from the inertial motion unit (108), using the various rotational matrices, as a function of the angle between the first device housing 102 and the second device housing 103 about the hinge 101 in one or more embodiments.

At step 806, the one or more processors (112) of the electronic device 100 then report the modified orientation measurements 810 along the three dimensions of the three-dimensional space 143 (or the modified orientation determination signal (148) directly) to the one or more applications—instead of the orientation determination signal (110). The one or more processors (112) continue to do this, in one or more embodiments, as long as the inertial motion unit adjustment engine (145) is activated, which means as long as the electronic device 100 is out of the closed position 201 of step 801 in this example. When the electronic device 100 transitions to the closed position 201, the optional inertial motion unit adjustment engine bypass (149), the one or more processors (112), another sensor (135), or another component (155) can deactivate the inertial motion unit adjustment engine (145) in this example Thus, to summarize the method 800 of FIG. 8, in this example the one or more processors (112) always report the orientation from the orientation determination signal (110) or the orientation determination signal (110) itself to applicable applications, but with the inertial motion unit adjustment engine (145) transforming this data by applying a rotation matrix 808 based upon an angle between the first device housing 102 and the second device housing 103.

Figure 9:
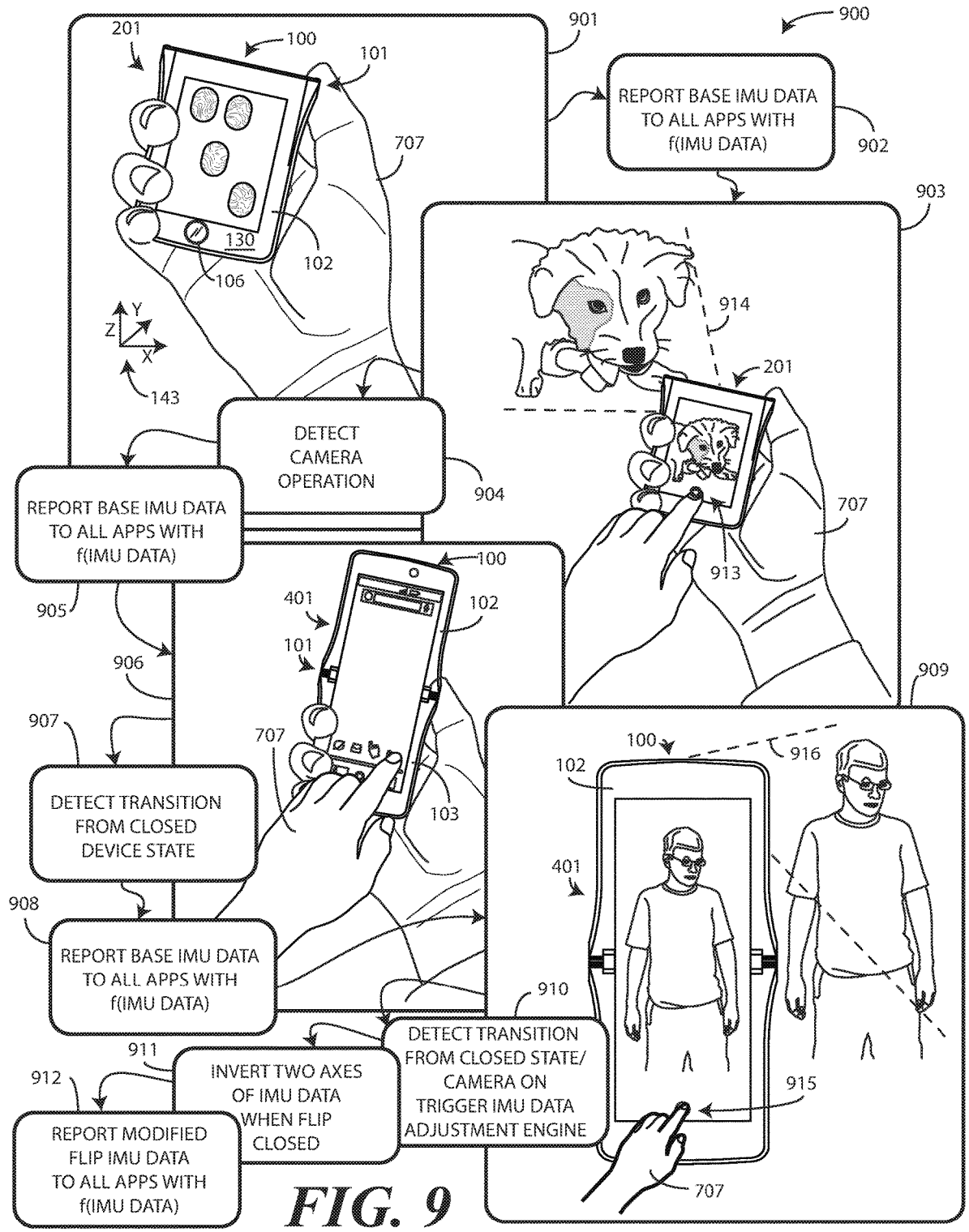
FIG. 9 illustrates one explanatory electronic device and one or more method steps in accordance with one or more embodiments of the disclosure.

Turning now to FIG. 9, illustrated therein is yet another explanatory method 900 for an electronic device configured in accordance with one or more embodiments of the disclosure. At step 901 is a user 707 holding the electronic device 100 of FIG. 1 while the electronic device 100 is in the closed position 201. As previously described, the electronic device 100 includes a first device housing 102 and a second device housing (hidden by first device housing 102 in step 901), as well as a hinge 101 coupling the first device housing 102 to the second device housing 103. The first device housing 102 is pivotable about the hinge 101 relative to the second device housing 103 between the closed position 201 of step 901 and the axially displaced open position 401 of step 906.

An imager 106 is situated on and/or coupled to an exterior 130 of the first device housing 102. In this illustrative embodiment, the electronic device 100 is also equipped with imager (129), which is situated on the exterior surface of the second device housing 103. As explained above with reference to FIG. 1, this inclusion of two imagers on the exterior of the electronic device 100 allows images to be captured in either direction when the electronic device 100 is in the closed position 201.

The electronic device 100 includes a first inertial motion unit (108), which is situated in the first device housing 102. In this illustrative embodiment, the electronic device 100 also includes a second inertial motion unit (109) situated in the second device housing 103). The first inertial motion unit (108) determines a first device housing orientation in three-dimensional space 143 and outputs the first device housing orientation in a first device housing orientation determination signal (110), while the second inertial motion unit (109) determines a second device housing orientation in the three-dimensional space 143 and outputs the second device housing orientation in a second device housing orientation determination signal (118).

At step 901, the electronic device 100 also includes an inertial motion unit adjustment engine (145), which is operable with the first inertial motion unit (108) and the second inertial motion unit (109). As before, the inertial motion unit adjustment engine (145) is activated by at least one predefined condition of the electronic device 100. When the inertial motion unit adjustment engine (145) is activated, by an inertial motion unit adjustment engine trigger (146), one or more processors (112) of the electronic device 100, or by other techniques or mechanisms, the inertial motion unit adjustment engine (145) causes an adjustment of the reporting of orientation data between the first inertial motion unit (108) and the second inertial motion unit (109) as a function of the predefined condition. In addition, the inertial motion unit adjustment engine (145) can optionally apply at least one correction factor (147) to the orientation determination signal (110) to create a modified orientation determination signal (148) when activated in the method 900 of FIG. 9.

At step 901, the electronic device 100 again includes one or more processors (112) that are operable with the first inertial motion unit (108), the second inertial motion unit (109), and the inertial motion unit adjustment engine (145). In one or more embodiments, the one or more processors (112) are configured to report the second device housing orientation obtained from the second device housing orientation determination signal (118) (or the second device housing orientation determination signal (118) itself), received from the second inertial motion unit (109), to one or more applications operating on the one or more processors when the inertial motion unit adjustment engine (145) is deactivated. By contrast, the one or more processors (112) are configured to report the first device housing orientation determination obtained from the first device housing orientation determination signal (110) (or the first device housing orientation determination signal (110) itself) to the one or more applications—instead of the second device housing orientation or second device housing orientation determination signal (118)—when the inertial motion unit adjustment engine (145) is activated.

At step 901, the one or more processors (112), optionally using the one or more hinge alignment detectors (117), the at least one inertial motion unit (108), or another sensor (135), detect that the electronic device 100 is in the closed position 201. At step 902, the one or more processors (112) of the electronic device 100 report, to any applications relying upon the orientation determinations from an inertial motion unit, the second device housing orientation obtained from the second device housing orientation determination signal (118) (or the second device housing orientation determination signal (118) itself). In this illustrative embodiment, the second device housing orientation obtained from the second device housing orientation determination signal (118) (or the second device housing orientation determination signal (118) itself) comprises orientation measurements along the three dimensions of the three-dimensional space 143. In this illustration, this includes at least an orientation measurement along the Z-axis, an orientation measurement along the X-axis, and an orientation measurement along the Y-axis.

In the illustrative example of FIG. 9, the at least one predefined condition comprises a combination of factors. Specifically, the at least one predefined condition comprises both the imager 106 being in an active mode of operation and at least one predefined angle occurring between the first device housing 102 and the second device housing 103 about the hinge 101. As before, this at least one predefined angle could be a single angle, such as zero degrees, 30 degrees, 45 degrees, 60, degrees, 90 degrees, 120 degrees, 135 degrees, 150 degrees, or 180 degrees. In other embodiments, the at least one predefined angle could include a plurality of predefined angles that span a range. In this example, the at least one predefined angle comprises the angles of one degree through 180 degrees, inclusive.

Since the electronic device 100 is in the closed position 201 at step 901, which is not one of the at least one predefined angles, the inertial motion unit adjustment engine (145) is deactivated at step 901. Moreover, the imager 106 is not active at step 901, so this causes the inertial motion unit adjustment engine (145) to remain in a deactivated state as well. Accordingly, at step 902, the one or more processors (112) report the second device housing orientation obtained from the second device housing orientation determination signal (118) (or the second device housing orientation determination signal (118) itself), and without any modification from the inertial motion unit adjustment engine (145).

At step 903, the user 707 is performing 913 an image capture operation 914 along a direction facing away from the exterior of the second device housing. This requires imager (129) to be in an active mode of operation. The one or more processors (112) detect that imager (129) is in the active mode of operation at step 904. Despite the fact that imager (129) is in operation, the inertial motion unit adjustment engine (145) remains in the deactivated state because the predefined condition of this example requires the electronic device 100 to be in a state other than the closed position 201 of steps 901 and 903. Since the electronic device 100 is not experiencing the required predefined condition of this example at step 903, at step 905 the one or more processors (112) report the second device housing orientation obtained from the second device housing orientation determination signal (118) (or the second device housing orientation determination signal (118) itself), and without any modification from the inertial motion unit adjustment engine (145).

At step 906, the user 707 transitions the electronic device 100 from the closed position 201 of steps 901 and step 903 to the axially displaced open position 401. Specifically, the user 700 has pivoted the first device housing 102 relative to the second device housing 103 about the hinge 101 from the closed position 201 to the axially displaced open position 401. At step 907, the one or more processors (112), optionally using the one or more hinge alignment detectors (117), the at least one inertial motion unit (108), or another sensor (135), detect that the electronic device 100 is now in the axially displaced open position 401.

Despite the fact that the electronic device 100 is now in the axially displaced open position 401, at step 906 the inertial motion unit adjustment engine (145) remains in the deactivated state because the predefined condition of this example requires not only that the electronic device 100 to be in a state other than the closed position 201 of steps 901 and 903, but also that an imager, be it imager 106 or imager (129) or another imager, be in an active mode of operation. Since the electronic device 100 is not experiencing the required predefined condition of this example at step 906, at step 908 the one or more processors (112) report the second device housing orientation obtained from the second device housing orientation determination signal (118) (or the second device housing orientation determination signal (118) itself), and without any modification from the inertial motion unit adjustment engine (145).

At step 909, the user 707 has activated an imager 106 carried by the first device housing 102, which is disposed on an exterior side 130 of the first device housing 102, facing away from the user. Additionally, the user 707 is performing 915 an image capture operation 916 along a direction facing away from the exterior of the first device housing 102.

The one or more processors (112) detect that imager 106 is in the active mode of operation at step 910. Additionally, the one or more processors (112), optionally using the one or more hinge alignment detectors (117), the at least one inertial motion unit (108), or another sensor (135), detect that the electronic device 100 is now in the axially displaced open position 401 at step 901. This combination of active imager and non-closed position causes the electronic device 100 to now be in the predefined condition of this example used to activate the inertial motion unit adjustment engine (145). In one or more embodiments, upon detecting this change, the one or more processors (112), the inertial motion unit adjustment engine trigger (146), or another component (155) activates the inertial motion unit adjustment engine (145) at step 910. Accordingly, at step 912, the one or more processors (112) report the first device housing orientation determination obtained from the first device housing orientation determination signal (110) (or the first device housing orientation determination signal (110) itself) to the one or more applications—instead of the second device housing orientation or second device housing orientation determination signal (118)—at step 912 due to the fact that the inertial motion unit adjustment engine (145) is activated. In one or more embodiments the one or more processors 112 and/or the inertial motion unit adjustment engine 145 perform a transition identification operation on the orientation determination signals being changed when the inertial motion unit adjustment engine 145 is activated to can one or both smooth the data that the one or more processors 112 report to the applications in the orientation determination signals and/or notify the applications that the accuracy of the data may be less than when the electronic device 100 is in a steady state.

The inertial motion unit adjustment engine (145) can optionally apply at least one correction factor (147) to the first device housing orientation determination obtained from the first device housing orientation determination signal (110) or the first device housing orientation determination signal (110) at step 911. Illustrating by example, in one or more embodiments step 911 comprises the inertial motion unit adjustment engine (145) applying at least one correction factor (147) comprising a rotation matrix (such as that shown above with reference to FIG. 8) that is a function of the at least one predefined angle of the first device housing orientation determination signal (110) when activated to create a modified first device housing orientation determination signal (148). Where this is the case, step 902, step 905, and step 908 would comprise the one or more processors (112) reporting the second device housing orientation determination signal (118) to the one or more applications when the inertial motion unit adjustment engine (145) is deactivated, while step 912 would comprise the one or more processors (112) reporting the modified first device housing orientation determination signal (148) to the one or more applications instead of the second device housing orientation determination signal (118) when the inertial motion unit adjustment engine (145) is activated.

Alternatively, where the predefined condition requires the electronic device 100 to be in the axially displaced open position 401 with at least one imager active, step 911 could comprise the inertial motion unit adjustment engine (145) applying an inversion, similar to that described above with reference to FIG. 7, to the first device housing orientation determination signal (110) when the electronic device 100 is in the axially displaced open position 401. Where this was the case, the inertial motion unit adjustment engine (145) would be deactivated when the first device housing 102 and the second device housing 103 pivot about the hinge 101 to the closed position 201.

It should be noted that step 911 is optional, and may not be included in some embodiments. Thus, to summarize the method 900 of FIG. 9, in this example the one or more processors (112) always report the second device housing orientation from the second device housing orientation determination signal (118) or the second device housing orientation determination signal (118) itself to applicable applications, unless the electronic device 100 is in a state other than the closed position 201, with an imager active. When this occurs, the one or more processors (112) report the first device housing orientation from the first device housing orientation determination signal (110) or the first device housing orientation determination signal (110), with optional correction from the inertial motion unit adjustment engine (145), be it an inversion, application of a rotation matrix, or other correction.

Figure 10:
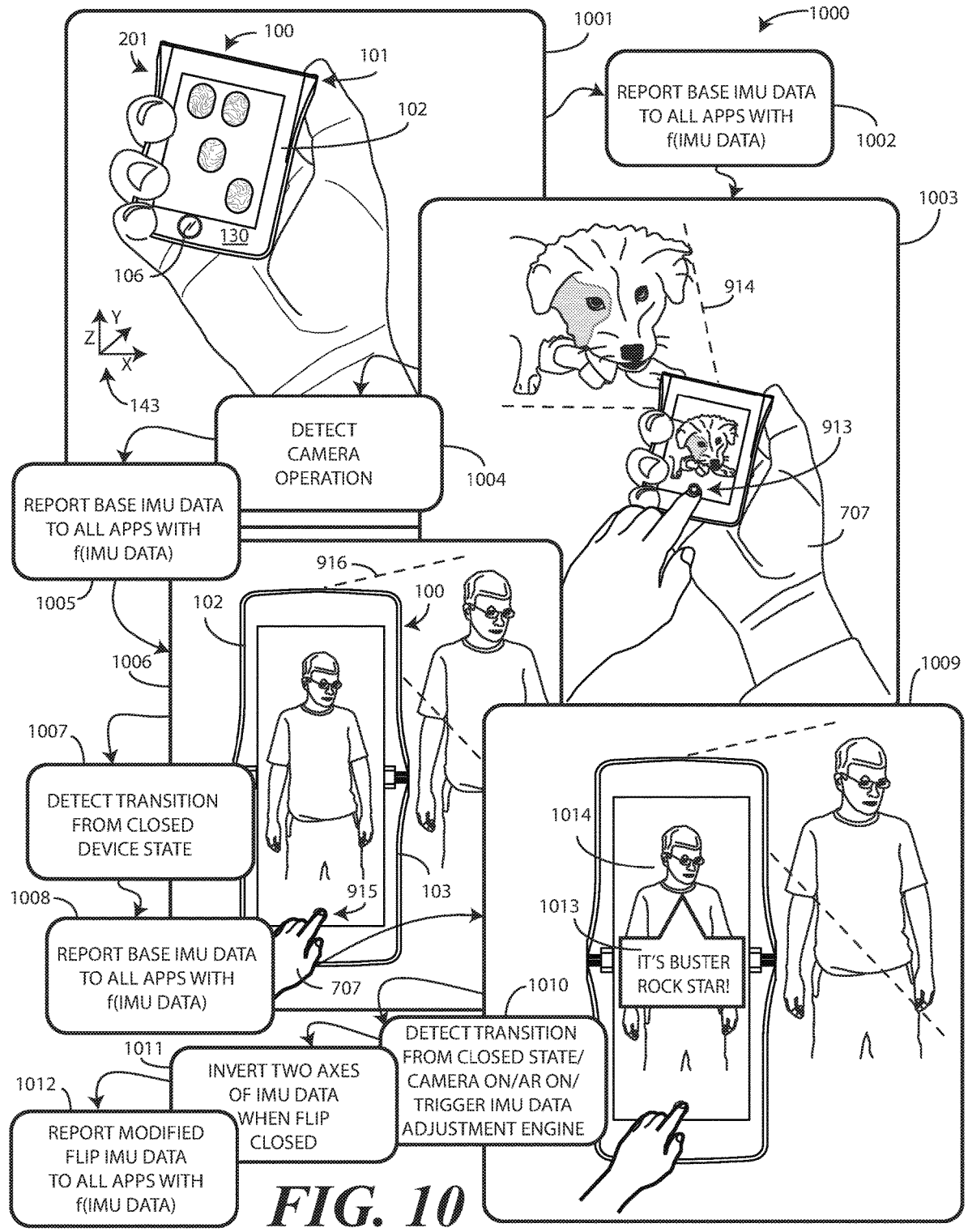
FIG. 10 illustrates one explanatory electronic device and one or more method steps in accordance with one or more embodiments of the disclosure.

Turning now to FIG. 10, illustrated therein is yet another explanatory method 1000 for an electronic device configured in accordance with one or more embodiments of the disclosure. At step 1001 is a user 707 holding the electronic device 100 of FIG. 1 while the electronic device 100 is in the closed position 201. As previously described, the electronic device 100 includes a first device housing 102 and a second device housing (hidden by first device housing 102 in step 1001), as well as a hinge 101 coupling the first device housing 102 to the second device housing 103. The first device housing 102 is pivotable about the hinge 101 relative to the second device housing 103 between the closed position 201 of step 1001 and the axially displaced open position 401 of step 906.

An imager 106 is situated on and/or coupled to an exterior 130 of the first device housing 102. In this illustrative embodiment, the electronic device 100 is also equipped with imager (129), which is situated on the exterior surface of the second device housing 103. As explained above with reference to FIG. 1, this inclusion of two imagers on the exterior of the electronic device 100 allows images to be captured in either direction when the electronic device 100 is in the closed position 201.

The electronic device 100 includes a first inertial motion unit (108), which is situated in the first device housing 102. In this illustrative embodiment, the electronic device 100 also includes a second inertial motion unit (109) situated in the second device housing 103). The first inertial motion unit (108) determines a first device housing orientation in three-dimensional space 143 and outputs the first device housing orientation in a first device housing orientation determination signal (110), while the second inertial motion unit (109) determines a second device housing orientation in the three-dimensional space 143 and outputs the second device housing orientation in a second device housing orientation determination signal (118).

At step 1001, the electronic device 100 also includes an inertial motion unit adjustment engine (145), which is operable with the first inertial motion unit (108) and the second inertial motion unit (109). As before, the inertial motion unit adjustment engine (145) is activated by at least one predefined condition of the electronic device 100. When the inertial motion unit adjustment engine (145) is activated, by an inertial motion unit adjustment engine trigger (146), one or more processors (112) of the electronic device 100, or by other techniques or mechanisms, the inertial motion unit adjustment engine (145) causes an adjustment of the reporting of orientation data between the first inertial motion unit (108) and the second inertial motion unit (109) as a function of the predefined condition. In addition, the inertial motion unit adjustment engine (145) can optionally apply at least one correction factor (147) to the orientation determination signal (110) to create a modified orientation determination signal (148) when activated in the method 1000 of FIG. 10.

At step 1001, the electronic device 100 again includes one or more processors (112) that are operable with the first inertial motion unit (108), the second inertial motion unit (109), and the inertial motion unit adjustment engine (145). In one or more embodiments, the one or more processors (112) are configured to report the second device housing orientation obtained from the second device housing orientation determination signal (118) (or the second device housing orientation determination signal (118) itself), received from the second inertial motion unit (109), to one or more applications operating on the one or more processors when the inertial motion unit adjustment engine (145) is deactivated. By contrast, the one or more processors (112) are configured to report the first device housing orientation determination obtained from the first device housing orientation determination signal (110) (or the first device housing orientation determination signal (110) itself) to the one or more applications—instead of the second device housing orientation or second device housing orientation determination signal (118)—when the inertial motion unit adjustment engine (145) is activated.

At step 1001, the one or more processors (112), optionally using the one or more hinge alignment detectors (117), the at least one inertial motion unit (108), or another sensor (135), detect that the electronic device 100 is in the closed position 201. At step 1002, the one or more processors (112) of the electronic device 100 report, to any applications relying upon the orientation determinations from an inertial motion unit, the second device housing orientation obtained from the second device housing orientation determination signal (118) (or the second device housing orientation determination signal (118) itself). In this illustrative embodiment, the second device housing orientation obtained from the second device housing orientation determination signal (118) (or the second device housing orientation determination signal (118) itself) comprises orientation measurements along the three dimensions of the three-dimensional space 143. In this illustration, this includes at least an orientation measurement along the Z-axis, an orientation measurement along the X-axis, and an orientation measurement along the Y-axis.

In the illustrative example of FIG. 10, the at least one predefined condition again comprises a combination of factors. Specifically, the at least one predefined condition comprises both an augmented reality application, e.g., the augmented reality engine (166), a navigation application (123) applying augmented reality features, or another application, actively operating on the one or more processors (112) and at least one predefined angle occurring between the first device housing 102 and the second device housing 103 about the hinge 101. In this example, the at least one predefined angle comprises the angles of forty-five degrees through 180 degrees, inclusive.

Since the electronic device 100 is in the closed position 201 at step 1001, which is not one of the at least one predefined angles, the inertial motion unit adjustment engine (145) is deactivated at step 1001. Moreover, there is no augmented reality application active at step 1001, so this causes the inertial motion unit adjustment engine (145) to remain in a deactivated state as well. Accordingly, at step 1002, the one or more processors (112) report the second device housing orientation obtained from the second device housing orientation determination signal (118) (or the second device housing orientation determination signal (118) itself), and without any modification from the inertial motion unit adjustment engine (145).

At step 1003, the user 707 is performing 913 an image capture operation 914 along a direction facing away from the exterior of the second device housing. This requires imager (129) to be in an active mode of operation. The one or more processors (112) detect that imager (129) is in the active mode of operation at step 1004. Despite the fact that imager (129) is in operation, the inertial motion unit adjustment engine (145) remains in the deactivated state because there is no augmented reality application running on the one or more processors (112). Moreover, the predefined condition of this example requires the first device housing 102 to be more at a greater than forty-five degree angle relative to the second device housing 103. Since the electronic device 100 is not experiencing the required predefined condition of this example at step 1003, at step 1005 the one or more processors (112) report the second device housing orientation obtained from the second device housing orientation determination signal (118) (or the second device housing orientation determination signal (118) itself), and without any modification from the inertial motion unit adjustment engine (145).

At step 1006, the user 707 has transitioned the electronic device 100 from the closed position 201 of steps 1001 and step 1003 to the axially displaced open position 401. Specifically, the user 700 has pivoted the first device housing 102 relative to the second device housing 103 about the hinge 101 from the closed position 201 to the axially displaced open position 401. At step 1007, the one or more processors (112), optionally using the one or more hinge alignment detectors (117), the at least one inertial motion unit (108), or another sensor (135), detect that the electronic device 100 is now in the axially displaced open position 401.

Additionally, at step 1006, the user 707 has activated an imager 106 carried by the first device housing 102, which is disposed on an exterior side 130 of the first device housing 102, facing away from the user. Additionally, the user 707 is performing 915 an image capture operation 916 along a direction facing away from the exterior of the first device housing 102.

Despite the fact that the electronic device 100 is now in the axially displaced open position 401, with the imager 106 in the active mode of operation, at step 1006 the inertial motion unit adjustment engine (145) remains in the deactivated state because the predefined condition of this example has not been met due to the fact that there is no augmented reality application operating on the one or more processors (112). Since the electronic device 100 is not experiencing the required predefined condition of this example at step 1006, at step 1008 the one or more processors (112) report the second device housing orientation obtained from the second device housing orientation determination signal (118) (or the second device housing orientation determination signal (118) itself), and without any modification from the inertial motion unit adjustment engine (145).

At step 1009, an augmented reality application, which in this example is a facial recognition application that identifies a subject and superimposed augmented reality content 1013 upon captured images 1014, is running on the one or more processors (112). Thus, the predefined condition of this example has now been met, as the electronic device 100 is experiencing the predefined condition at step 10009.

The one or more processors (112) detect the predefined condition occurring at step 1010. In one or more embodiments, upon detecting this change, the one or more processors (112), the inertial motion unit adjustment engine trigger (146), or another component (155) activates the inertial motion unit adjustment engine (145) at step 1010. Accordingly, at step 1012, the one or more processors (112) report the first device housing orientation obtained from the first device housing orientation determination signal (110) (or the first device housing orientation determination signal (110) itself) to the one or more applications—instead of the second device housing orientation or second device housing orientation determination signal (118)—at step 1012 due to the fact that the inertial motion unit adjustment engine (145) is activated. In one or more embodiments the one or more processors 112 and/or the inertial motion unit adjustment engine 145 perform a transition identification operation on the orientation determination signals when the inertial motion unit adjustment engine 145 is activated, as previously described, to can one or both smooth the data that the one or more processors 112 report to the applications in the orientation determination signals and/or notify the applications that the accuracy of the data may be less than when the electronic device 100 is in a steady state.

As with the method (900) of FIG. 9, the inertial motion unit adjustment engine (145) can optionally apply at least one correction factor (147) to the first device housing orientation determination obtained from the first device housing orientation determination signal (110) or the first device housing orientation determination signal (110) at step 1011. This modification can include applying at least one correction factor (147) comprising a rotation matrix (such as that shown above with reference to FIG. 8) that is a function of the at least one predefined angle between the first device housing 102 and the second device housing 103. Where this is the case, step 1002, step 1005, and step 908 would comprise the one or more processors (112) reporting the second device housing orientation determination signal (118) to the one or more applications when the inertial motion unit adjustment engine (145) is deactivated, while step 1012 would comprise the one or more processors (112) reporting the modified first device housing orientation determination signal (148) to the one or more applications instead of the second device housing orientation determination signal (118) when the inertial motion unit adjustment engine (145) is activated.

Alternatively, where the predefined condition requires the electronic device 100 to be in the axially displaced open position 401 with at least one imager active, step 1011 could comprise the inertial motion unit adjustment engine (145) applying an inversion, similar to that described above with reference to FIG. 7, to the first device housing orientation determination signal (110) when the electronic device 100 is in the axially displaced open position 401. Where this was the case, the inertial motion unit adjustment engine (145) would be deactivated when the first device housing 102 and the second device housing 103 pivot about the hinge 101 to the closed position 201.

It should be noted that step 1011 is optional, and may not be included in some embodiments. Thus, to summarize the method 1000 of FIG. 10, in this example the one or more processors (112) always report the second device housing orientation from the second device housing orientation determination signal (118) or the second device housing orientation determination signal (118) itself to applicable applications, unless the electronic device 100 defines a predefined angle between the first device housing 102 and second device housing 103 about the hinge 101, with an augmented reality application actively operating on the one or more processors (112). When this occurs, the one or more processors (112) report the first device housing orientation from the first device housing orientation determination signal (110) or the first device housing orientation determination signal (110), with optional correction from the inertial motion unit adjustment engine (145), be it an inversion, application of a rotation matrix, or other correction.

Figure 11:
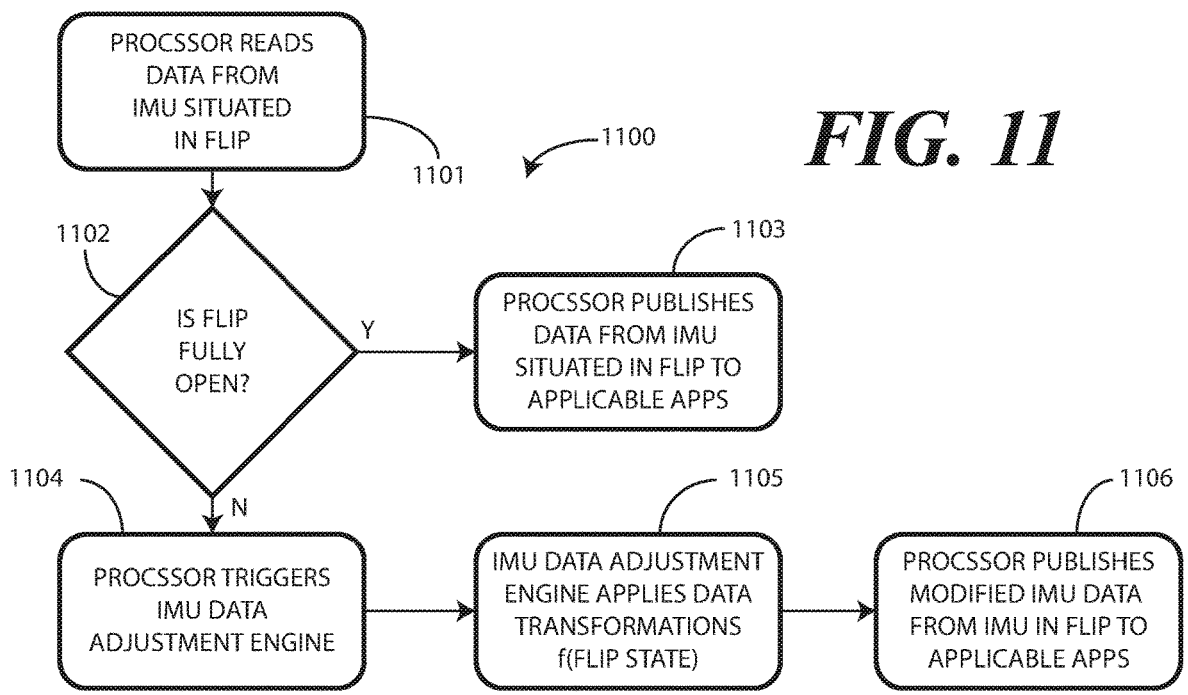
FIG. 11 illustrates one explanatory method in accordance with one or more embodiments of the disclosure.

Turning now to FIG. 11, illustrated therein is another method 1100 in accordance with one or more embodiments of the disclosure. Beginning at step 1101, one or more processors of an electronic device receive an orientation determination signal from an inertial motion unit situated in a first device housing of the electronic device. In one or more embodiments, the first device housing is pivotable about a hinge relative to a second device housing from a closed position to an axially displaced open position, with the first device housing atop the second device housing in a normal mode of operation. This results in the first device housing being the "flip," while the second device housing is the "base" of the electronic device.

Decision 1102 determines whether the electronic device is in the axially displaced open position. Where it is, step 1103 comprises the one or more processors of the electronic device reporting the orientation determination signals received from the inertial motion unit situated in a first device housing of the electronic device at step 1101 to one or more applications operating on the one or more processors that use orientation data as inputs.

However, in the method 1100 of FIG. 11, the one or more processors are operable to activate an inertial motion unit adjustment engine in response to detecting at least one predefined condition of the electronic device. In this example, the predefined condition occurs when the electronic device is not in the axially displaced open position. Thus, the predefined condition would include the closed position and any angle between the first device housing and the second device housing other than when the first device housing is pivoted about the hinge relative to the second device housing to the axially displaced open position. Since the inertial motion unit adjustment engine is deactivated at step 1103, the one or more processors report the orientation determination signal received from the inertial motion unit situated in the first device housing at step 1103 as previously described.

However, if decision 1102 determines the electronic device not to be in the axially displaced open position, the electronic device is experiencing the predefined condition of this example. Accordingly, step 1104 comprises the one or more processors activating the inertial motion unit adjustment engine in response to detecting the predefined condition of the electronic device.

At step 1105, the inertial motion unit adjustment engine, when activated by the one or more processors, applies at least one correction factor to an orientation determination signal received from the inertial motion unit situated in the first device housing to create a modified orientation determination signal. At step 1106, the one or more processors report the modified orientation determination signal to the one or more applications operating on the one or more processors since the inertial motion unit adjustment engine is activated.

Figure 12:
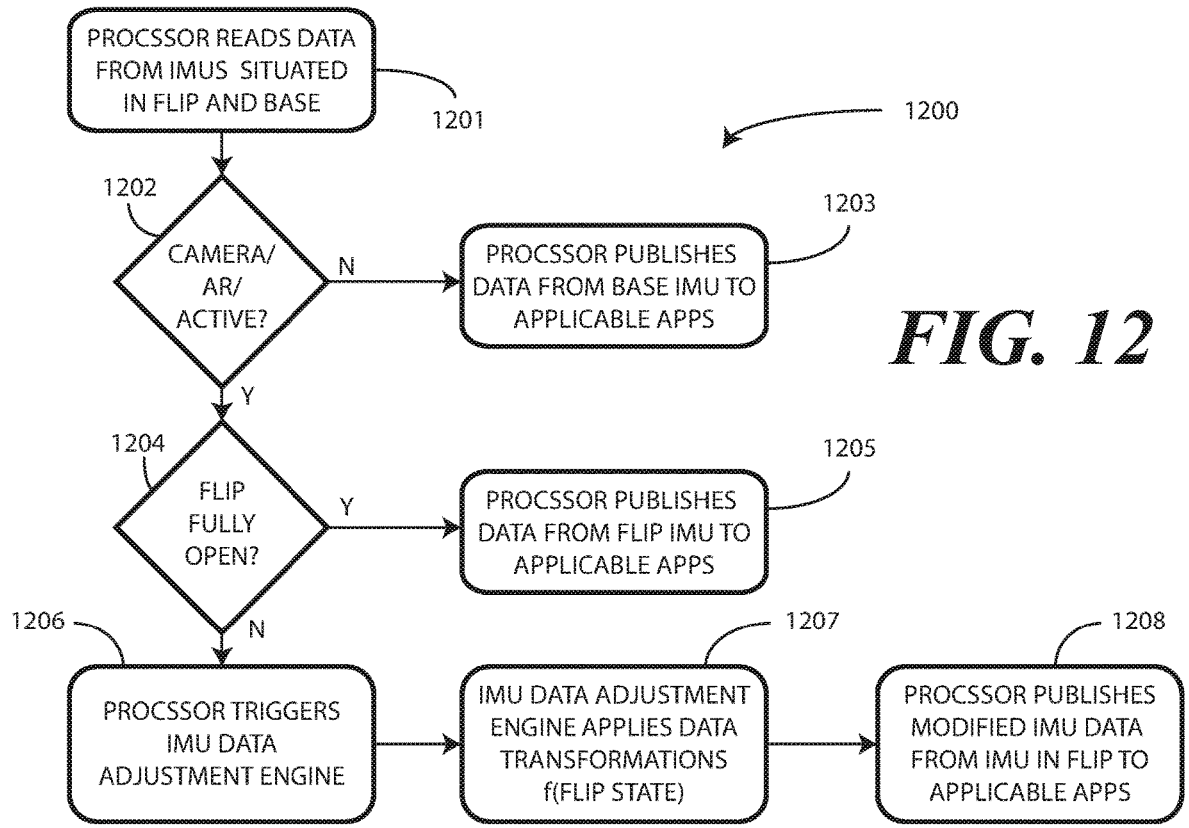
FIG. 12 illustrates one explanatory method in accordance with one or more embodiments of the disclosure.

Turning now to FIG. 12, illustrated therein is another method 1200 in accordance with one or more embodiments of the disclosure. At step 1201, one or more processors of the electronic device receive first device housing orientation determination signals from a first inertial motion unit situated in a first device housing that is coupled to a second device housing by a hinge. In one or more embodiments, step 1201 also includes the one or more processors receiving second device housing orientation determination signals from a second inertial motion unit situated in the second device housing as well.

At decision 1202, the one or more processors determine whether an imager is active on the electronic device. In one or more embodiments, decision 1202 comprises the one or more processors determining whether an imager, operable with the one or more processors, is performing an image capture operation. Where it is not, at step 1203 the one or more processors report the second device housing orientation determination signals to one or more applications operating on the one or more processors due to the fact that an inertial motion unit adjustment engine operable with the one or more processors is deactivated.

Where the imager is active, or is performing an image capture operation, at decision 1204 the one or more processors determine whether the electronic device is in the axially displaced open position. Where it is, the one or more processors report the first device housing orientation determination signals received from the first inertial motion unit to the one or more applications at step 1205. However, when the electronic device is in a condition other than the axially displaced open position, step 1206 comprises activating the inertial motion unit adjustment engine in response to detecting a predefined condition of the electronic device, which in this example is the electronic device being not in the axially displaced open position, but with the imager active or actively performing an image capture operation.

At step 1207, the inertial motion unit adjustment engine, when activated by the one or more processors, applies at least one correction factor to an orientation determination signal received from the inertial motion unit situated in the first device housing to create a modified orientation determination signal. At step 1208, the one or more processors report the modified orientation determination signal to the one or more applications operating on the one or more processors since the inertial motion unit adjustment engine is activated.

Figure 13:
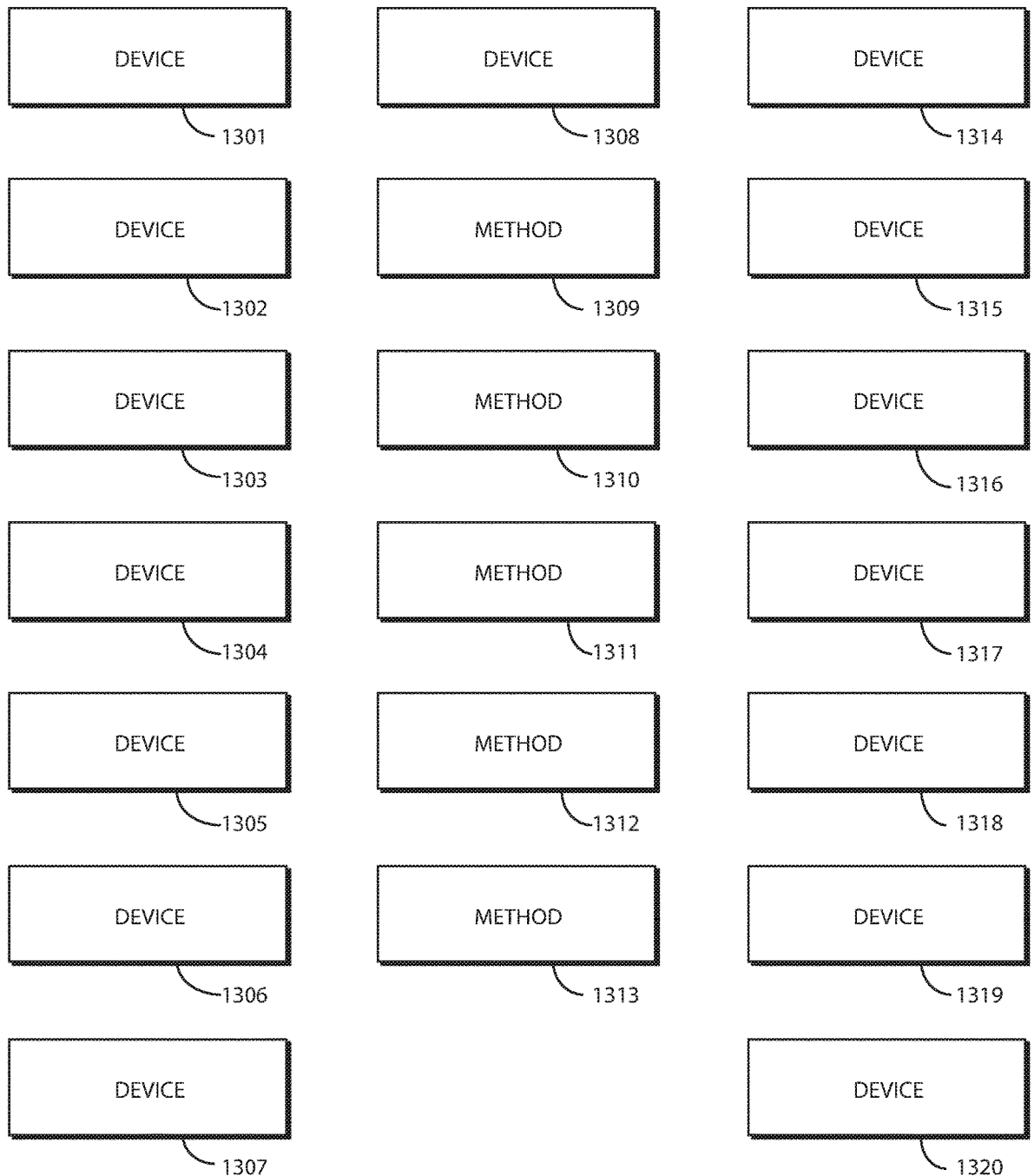
FIG. 13 illustrates one or more embodiments of the disclosure.

Turning now to FIG. 13, illustrated therein are one or more embodiments of the disclosure. At 1301, an electronic device comprises a first device housing and a second device housing. At 1301, a hinge couples the first device housing to the second device housing. At 1301, the first device housing is pivotable about the hinge relative to the second device housing between a closed position and an axially displaced open position.

At 1301, at least one inertial motion unit is situated in the first device housing. At 1301, the at least one inertial motion unit determines an orientation of the first device housing in three-dimensional space and outputs the orientation in an orientation determination signal.

At 1301, an inertial motion unit adjustment engine is activated by at least one predefined condition of electronic device. At 1301, the inertial motion unit adjustment engine applies at least one correction factor to the orientation determination signal when activated to create a modified orientation determination signal.

At 1302, the electronic device of 1301 further comprises one or more processors operable with the at least one inertial motion unit and the inertial motion unit adjustment engine. At 1302, the one or more processors report the orientation determination signal to one or more applications operating on the one or more processors when the inertial motion unit adjustment engine is deactivated. At 1302, the one or more processors report the modified orientation determination signal to the one or more applications instead of the orientation determination signal when the inertial motion unit adjustment engine is activated.

At 1303, the orientation determination signal of 1302 comprises orientation measurements along the three dimensions of the three-dimensional space. At 1303, the at least one predefined condition comprises the first device housing and the second device housing being pivoted about the hinge to the closed position. At 1303, the at least one correction factor causes an inversion of the orientation measurements of two dimensions of the three dimensions of the three-dimensional space.

At 1304, the at least one predefined operating condition of 1302 comprises at least one predefined angle occurring between the first device housing and the second device housing about the hinge. At 1304, the correction factor comprises a rotation matrix that is a function of the at least one predefined angle.

At 1305, the electronic device of 1302 further comprises an imager coupled to one of the first device housing or the second device housing. At 1305, the imager is operable with the one or more processors. At 1305, the at least one predefined condition comprises both the imager being in an active mode of operation and at least one predefined angle occurring between the first device housing and the second device housing about the hinge.

At 1306, the electronic device of 1302 further comprises an imager coupled to one of the first device housing or the second device housing. At 1306, the imager is operable with the one or more processors. At 1306, the one or more applications comprise an augmented reality application operable with the imager. At 1306, the at least one predefined condition comprises both the augmented reality application actively operating on the one or more processors and at least one predefined angle occurring between the first device housing and the second device housing about the hinge.

At 1307, the inertial motion unit adjustment engine of 1302 is deactivated when the first device housing and the second device housing pivot about the hinge to the axially displaced open position. At 1308, the at least one inertial motion unit of 1302 comprises a first inertial motion unit situated in the first device housing and a second inertial motion unit situated in the second device housing.

At 309, a method in an electronic device comprises activating, by one or more processors, an inertial motion unit adjustment engine in response to detecting at least one predefined condition of the electronic device. At 1309, the method comprises applying, by the inertial motion unit adjustment engine, when activated by the one or more processors, at least one correction factor to an orientation determination signal received from at least one inertial motion unit situated in a first device housing of the electronic device that is pivotable about a hinge relative to a second device housing of the electronic device to create a modified orientation determination signal. At 1309, the method comprises reporting, by the one or more processors, the modified orientation determination signal to one or more applications operating on the one or more processors when the inertial motion unit adjustment engine is activated.

At 1310, the method of 1309 comprises reporting, by the one or more processors, the orientation determination signal to the one or more applications when the inertial motion unit adjustment engine is deactivated. At 1311, the method of 1309 comprises reporting, by the one or more processors, another orientation determination signal received from at least one other inertial motion unit situated in the second device housing when the inertial motion unit adjustment engine is deactivated.

At 1312, the predefined condition of 1311 comprises an imager, operable with the one or more processors, performing an image capture operation. At 1313, the predefined condition of 1311 comprises an augmented reality application, operable with an imager of the electronic device, actively operating on the one or more processors.

At 1314, an electronic device comprises a first device housing and a second device housing. At 1314, the electronic device comprises a hinge coupling the first device housing to the second device housing. At 1314, the first device housing is pivotable about the hinge relative to the second device housing between a closed position and an axially displaced open position.

At 1314, the electronic device comprises a first inertial motion unit, situated in the first device housing. At 1314, the first inertial motion unit determines a first device housing orientation in three-dimensional space and outputs the first device housing orientation in a first device housing orientation determination signal.

At 1314, the electronic device comprises a second inertial motion unit, situated in the second device housing. At 1314, the second inertial motion unit determines a second device housing orientation in the three-dimensional space and outputs the second device housing orientation in a second device housing orientation determination signal.

At 1314, the electronic device comprises an inertial motion unit adjustment engine, operable with the first inertial motion unit and the second inertial motion unit and activated by at least one predefined condition of the electronic device. At 1314, the electronic device comprises one or more processors operable with the inertial motion unit adjustment engine.

At 1314, the one or more processors report the second device housing orientation determination signal to one or more applications operating on the one or more processors when the inertial motion unit adjustment engine is deactivated. At 1314, the one or more processors report the first device housing orientation determination signal to the one or more applications instead of the second device housing orientation determination signal when the inertial motion unit adjustment engine is activated.

At 1315, the electronic device of 1214 further comprises an imager coupled to one of the first device housing or the second device housing and operable with the one or more processors. At 1315, the at least one predefined condition comprises the imager being in an active mode of operation.

At 1316, the at least one predefined condition of 1315 further comprises at least one predefined angle occurring between the first device housing and the second device housing about the hinge. At 1317, the inertial motion unit adjustment engine of 1316 applies at least one correction factor comprising a rotation matrix that is a function of the at least one predefined angle to the first device housing orientation determination signal when activated to create a modified first device housing orientation determination signal. At 1317, the one or more processors report the second device housing orientation determination signal to the one or more applications when the inertial motion unit adjustment engine is deactivated, and report the modified first device housing orientation determination signal to the one or more applications instead of the second device housing orientation determination signal when the inertial motion unit adjustment engine is activated.

At 1318, the electronic device of 1314 further comprises an imager coupled to one of the first device housing or the second device housing and operable with the one or more processors. At 1318, the one or more applications comprise an augmented reality application operable with the imager. At 1318, the at least one predefined condition comprises the augmented reality application actively operating on the one or more processors.

At 1319, the inertial motion unit adjustment engine of 1318 applies at least one correction factor to the first device housing orientation determination signal when activated to create a modified first device housing orientation determination signal. At 1319, the one or more processors report the second device housing orientation determination signal to the one or more applications when the inertial motion unit adjustment engine is deactivated, and report the modified first device housing orientation determination signal to the one or more applications instead of the second device housing orientation determination signal when the inertial motion unit adjustment engine is activated. At 1320, the inertial motion unit adjustment engine of 1214 is deactivated when the first device housing and the second device housing pivot about the hinge to the closed position.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

For example, in one or more embodiments, one or more processors receive orientation determination signals from each inertial motion unit. In one or more embodiments, the one or more processors report a composite orientation determination signal stream to various applications running on the processor. In one or more embodiments, when the first device housing pivots about the hinge relative to the second device housing to the closed position, the one or more processors report orientation determination signals from the first inertial motion unit situated in the first device housing to the applications with the two non-hinged axes inverted. By contrast, when the first device housing pivots about the hinge relative to the second device housing to the axially displaced open position, the one or more processors report the orientation determination signals from the inertial motion unit situated in the first device housing directly without inversion.

In one or more embodiments, when both the first device housing is pivoted about the hinge relative to the second device housing to the axially displaced open position and the imager is transitioned to an active mode of operation and/or is performing image capture operations, the one or more processors report orientation determination signals from the inertial motion unit situated in the first device housing. By contrast, when the first device housing is pivoted about the hinge relative to the second device housing to the closed position, the one or more processors report orientation determination signals from the inertial motion unit situated in the second device housing, even when the imager is active. Alternatively, the one or more processors can report composite orientation determination signals from both the inertial motion unit situated in the first device housing and the inertial motion unit situated in the second device housing, but with the two non-hinge axes inverted, as previously described.

In one or more embodiments, when both the first device housing is pivoted about the hinge relative to the second device housing to the axially displaced open position and an augmented reality application or hardware component is transitioned to an active mode of operation and/or is performing augmented reality operations, the one or more processors report orientation determination signals from the inertial motion unit situated in the first device housing. By contrast, when the first device housing is pivoted about the hinge relative to the second device housing to the closed position, the one or more processors report orientation determination signals from the inertial motion unit situated in the second device housing, even when the augmented reality application or component is active. Alternatively, the one or more processors can report composite orientation determination signals from both the inertial motion unit situated in the first device housing and the inertial motion unit situated in the second device housing, but with the two non-hinge axes inverted.

In one or more embodiments, when the first device housing is pivoted about the hinge relative to the second device housing to the closed position, the one or more processors only report orientation determination signals from the inertial motion unit situated in the second device housing. In one or more embodiments, this reporting of only orientation determination signals from the inertial motion unit situated in the second device housing only occurs when the imager and/or the augmented reality function is inactive.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a first device housing and a second device housing;
   a hinge coupling the first device housing to the second device housing, the first device housing pivotable about the hinge relative to the second device housing between a closed position and an axially displaced open position;
   at least one inertial motion unit, situated in the first device housing, the at least one inertial motion unit determining an orientation of the first device housing in three-dimensional space and outputting the orientation in an orientation determination signal;
   an inertial motion unit adjustment engine, activated by at least one predefined condition of electronic device, the inertial motion unit adjustment engine applying at least one correction factor to the orientation determination signal when activated to create a modified orientation determination signal; and
   one or more processors operable with the at least one inertial motion unit and the inertial motion unit adjustment engine, the one or more processors reporting the orientation determination signal to one or more applications operating on the one or more processors when the inertial motion unit adjustment engine is deactivated, and reporting the modified orientation determination signal to the one or more applications instead of the orientation determination signal when the inertial motion unit adjustment engine is activated.

2. The electronic device of claim 1, further comprising an imager coupled to the first device housing and operable with the one or more processors.

3. The electronic device of claim 1, the orientation determination signal comprising orientation measurements along the three dimensions of the three-dimensional space, the at least one predefined condition comprising the first device housing and the second device housing being pivoted about the hinge to the closed position, and the at least one correction factor causing an inversion of the orientation measurements of two dimensions of the three dimensions of the three-dimensional space.

4. The electronic device of claim 1, the at least one predefined condition comprising at least one predefined angle occurring between the first device housing and the second device housing about the hinge, the correction factor comprising a rotation matrix that is a function of the at least one predefined angle.

5. The electronic device of claim 1, further comprising an imager coupled to one of the first device housing or the second device housing and operable with the one or more processors, the at least one predefined condition comprising both the imager being in an active mode of operation and at least one predefined angle occurring between the first device housing and the second device housing about the hinge.

6. The electronic device of claim 1, further comprising an imager coupled to one of the first device housing or the second device housing and operable with the one or more processors, wherein the one or more applications comprise an augmented reality application operable with the imager, the at least one predefined condition comprising both the augmented reality application actively operating on the one or more processors and at least one predefined angle occurring between the first device housing and the second device housing about the hinge.

7. The electronic device of claim 1, wherein one of the one or more processors or the inertial motion unit adjustment engine further performs a transition identification operation on the modified orientation determination signal.

8. The electronic device of claim 1, the at least one inertial motion unit comprising a first inertial motion unit situated in the first device housing and a second inertial motion unit situated in the second device housing.

9. A method in an electronic device, the method comprising:
  activating, by one or more processors, an inertial motion unit adjustment engine in response to detecting at least one predefined condition of the electronic device;
  applying, by the inertial motion unit adjustment engine, when activated by the one or more processors, at least one correction factor to an orientation determination signal received from at least one inertial motion unit situated in a first device housing of the electronic device that is pivotable about a hinge relative to a second device housing of the electronic device to create a modified orientation determination signal; and
  reporting, by the one or more processors, the modified orientation determination signal to one or more applications operating on the one or more processors when the inertial motion unit adjustment engine is activated.

10. The method of claim 9, further comprising reporting, by the one or more processors, the orientation determination signal to the one or more applications when the inertial motion unit adjustment engine is deactivated.

11. The method of claim 9, further comprising reporting, by the one or more processors, another orientation determination signal received from at least one other inertial motion unit situated in the second device housing when the inertial motion unit adjustment engine is deactivated.

12. The method of claim 11, the predefined condition comprising an imager, operable with the one or more processors, performing an image capture operation.

13. The method of claim 11, the predefined condition further comprising an augmented reality application, operable with an imager of the electronic device, actively operating on the one or more processors.

14. An electronic device, comprising:
  a first device housing and a second device housing;
  a hinge coupling the first device housing to the second device housing, the first device housing pivotable about the hinge relative to the second device housing between a closed position and an axially displaced open position;
  a first inertial motion unit, situated in the first device housing, the first inertial motion unit determining a first device housing orientation in three-dimensional space and outputting the first device housing orientation in a first device housing orientation determination signal;
  a second inertial motion unit, situated in the second device housing, the second inertial motion unit determining a second device housing orientation in the three-dimensional space and outputting the second device housing orientation in a second device housing orientation determination signal;
  an inertial motion unit adjustment engine, operable with the first inertial motion unit and the second inertial motion unit and activated by at least one predefined condition of the electronic device; and
  one or more processors operable with the inertial motion unit adjustment engine, the one or more processors reporting the second device housing orientation determination signal to one or more applications operating on the one or more processors when the inertial motion unit adjustment engine is deactivated, and reporting the first device housing orientation determination signal to the one or more applications instead of the second device housing orientation determination signal when the inertial motion unit adjustment engine is activated.

15. The electronic device of claim 14, further comprising an imager coupled to one of the first device housing or the second device housing and operable with the one or more processors, the at least one predefined condition comprising the imager being in an active mode of operation.

16. The electronic device of claim 15, the at least one predefined condition further comprising at least one predefined angle occurring between the first device housing and the second device housing about the hinge.

17. The electronic device of claim 16, the inertial motion unit adjustment engine applying at least one correction factor comprising a rotation matrix that is a function of the at least one predefined angle to the first device housing orientation determination signal when activated to create a modified first device housing orientation determination signal, the one or more processors reporting the second device housing orientation determination signal to the one or more applications when the inertial motion unit adjustment engine is deactivated, and reporting the modified first device housing orientation determination signal to the one or more applications instead of the second device housing orientation determination signal when the inertial motion unit adjustment engine is activated.

18. The electronic device of claim 14, further comprising an imager coupled to one of the first device housing or the second device housing and operable with the one or more processors, wherein the one or more applications comprise an augmented reality application operable with the imager, the at least one predefined condition comprising the augmented reality application actively operating on the one or more processors.

19. The electronic device of claim 18, the inertial motion unit adjustment engine applying at least one correction factor to the first device housing orientation determination signal when activated to create a modified first device housing orientation determination signal, wherein the one or more processors report the second device housing orientation determination signal to the one or more applications when the inertial motion unit adjustment engine is deactivated, and report the modified first device housing orientation determination signal to the one or more applications instead of the second device housing orientation determination signal when the inertial motion unit adjustment engine is activated.

20. The electronic device of claim 14, wherein the inertial motion unit adjustment engine is deactivated when the first device housing and the second device housing pivot about the hinge to the closed position.

* * * * *